(12) United States Patent
Vali et al.

(10) Patent No.: US 9,589,659 B1
(45) Date of Patent: Mar. 7, 2017

(54) PRE-COMPENSATION OF MEMORY THRESHOLD VOLTAGE

(71) Applicant: MICRON TECHNOLOGY, INC., Boise, ID (US)

(72) Inventors: Tommaso Vali, Sezze (IT); Andrea D'Alessandro, L'Aquila (IT); Violante Moschiano, Avezzano (IT); Mattia Cichocki, Rome (IT); Michele Incarnati, Gioia Dei Marsi (IT); Federica Paolini, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/164,171

(22) Filed: May 25, 2016

(51) Int. Cl.
*G11C 16/04* (2006.01)
*G11C 16/34* (2006.01)
(Continued)

(52) U.S. Cl.
CPC ...... *G11C 16/3459* (2013.01); *G11C 11/5628* (2013.01); *G11C 11/5642* (2013.01);
(Continued)

(58) Field of Classification Search
CPC . G11C 16/10; G11C 16/3459; G11C 16/0483; G11C 16/26; G11C 13/004;
(Continued)

(56) References Cited

U.S. PATENT DOCUMENTS

| | | | |
|---|---|---|---|
| 7,149,117 | B2 | 12/2006 | Roohparvar |
| 7,400,532 | B2 | 7/2008 | Aritome |

(Continued)

*Primary Examiner* — Son Dinh
*Assistant Examiner* — Uyen B Tran
(74) *Attorney, Agent, or Firm* — Dicke, Billig & Czaja, PLLC

(57) ABSTRACT

Methods of operating a memory include storing a first target data state of multiple possible data states of a first memory cell to be programmed in a target data latch coupled to a data node, storing at least one bit of a second target data state of the multiple possible data states of a second memory cell to be programmed in an aggressor data latch coupled to the data node, and programming the first memory cell and performing a program verify operation for the first target data state to determine if the first memory cell is verified for the first target data state. The program verify operation including: an intermediate verify corresponding to an amount of aggression to apply a voltage to the data node when performing the intermediate verify, based on the at least one bit of the second target state stored in the aggressor data latch; and a program verify corresponding to a condition of no aggression to apply to the voltage to the data node when performing the program verify, based on the at least one bit of the second target state stored in the aggressor data latch. The methods including inhibiting the first memory cell from further programming if the first memory cell is verified during the intermediate verify and the at least one bit in the aggressor data latch corresponds to the particular amount of aggression, or the first memory cell is verified during the program verify and the at least one bit in the aggressor data latch corresponds to the condition of no aggression. The second memory cell is a neighbor of the first memory cell.

20 Claims, 14 Drawing Sheets

(51) Int. Cl.
*G11C 11/56* (2006.01)
*G11C 16/10* (2006.01)
*G11C 16/26* (2006.01)
*G11C 16/14* (2006.01)

(52) U.S. Cl.
CPC .............. *G11C 16/10* (2013.01); *G11C 16/14* (2013.01); *G11C 16/26* (2013.01)

(58) Field of Classification Search
CPC ............ G11C 13/0069; G11C 11/1673; G11C 11/1675; G11C 11/4091; G11C 11/5628; G11C 11/5642; G11C 16/0408; G11C 16/0433; G11C 16/345
See application file for complete search history.

(56) References Cited

U.S. PATENT DOCUMENTS

| | | | |
|---|---|---|---|
| 7,471,571 B2 | 12/2008 | Visconti et al. | |
| 7,688,633 B2 | 3/2010 | Martinelli et al. | |
| 7,701,765 B2 | 4/2010 | Aritome | |
| 7,746,691 B2 | 6/2010 | Roohparvar et al. | |
| 7,952,922 B2 | 5/2011 | Aritome | |
| 7,969,788 B2 | 6/2011 | Moschiano et al. | |
| 8,085,591 B2 | 12/2011 | Moschiano et al. | |
| 8,164,959 B2 | 4/2012 | Khaef | |
| 8,233,329 B2 | 7/2012 | Vali et al. | |
| 8,243,513 B2 | 8/2012 | Sarin et al. | |
| 8,537,623 B2 | 9/2013 | Kawai et al. | |
| 8,902,668 B1 * | 12/2014 | Dutta | G11C 16/3459 365/185.02 |
| 9,030,870 B2 | 5/2015 | Moschiano et al. | |
| 9,087,594 B2 | 7/2015 | Moschiano et al. | |
| 2009/0141558 A1 | 6/2009 | Sarin et al. | |
| 2011/0063919 A1 | 3/2011 | Chandrasekhar et al. | |
| 2013/0322170 A1 | 12/2013 | Goldman et al. | |
| 2014/0119126 A1 * | 5/2014 | Dutta | G11C 11/5628 365/185.19 |
| 2015/0146488 A1 * | 5/2015 | Lim | G11C 16/0483 365/185.11 |

\* cited by examiner

# US 9,589,659 B1

PRE-COMPENSATION OF MEMORY THRESHOLD VOLTAGE

TECHNICAL FIELD

The present disclosure relates generally to memory, in particular, in one or more embodiments, the present disclosure relates to programming operations in flash memory devices using multiple verify levels to verify a data state.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

One type of flash memory cell is a single level cell (SLC) which may be programmed to a targeted one of two different data states, such as 1 or 0. Another type of flash memory cell is a multi-level cell (MLC) which may be programmed to a targeted one of more than two data states. MLCs may provide higher density memories without increasing the number of memory cells since each cell might represent more than one bit.

A data state of a flash memory cell might be determined by sensing the stored charge on the charge storage structure (i.e., Vt) of the memory cell. Charge storage in charge storage structures of neighboring memory cells may inadvertently change the functional Vt of the selected memory cell, particularly if several neighboring memory cells are in a programmed state. When combined with other factors, such as capacitive coupling, temperature fluctuations, program/erase cycling, and storage of multiple bits of data per memory, the influence of neighboring charge storage structures may cause a memory cell to be misread.

For the reasons stated above, and for other reasons stated below which will become apparent to those skilled in the art upon reading and understanding the present specification, there is a need in the art for alternative methods of operating memory, and apparatus to perform such methods.

DETAILED DESCRIPTION

Figure 1:
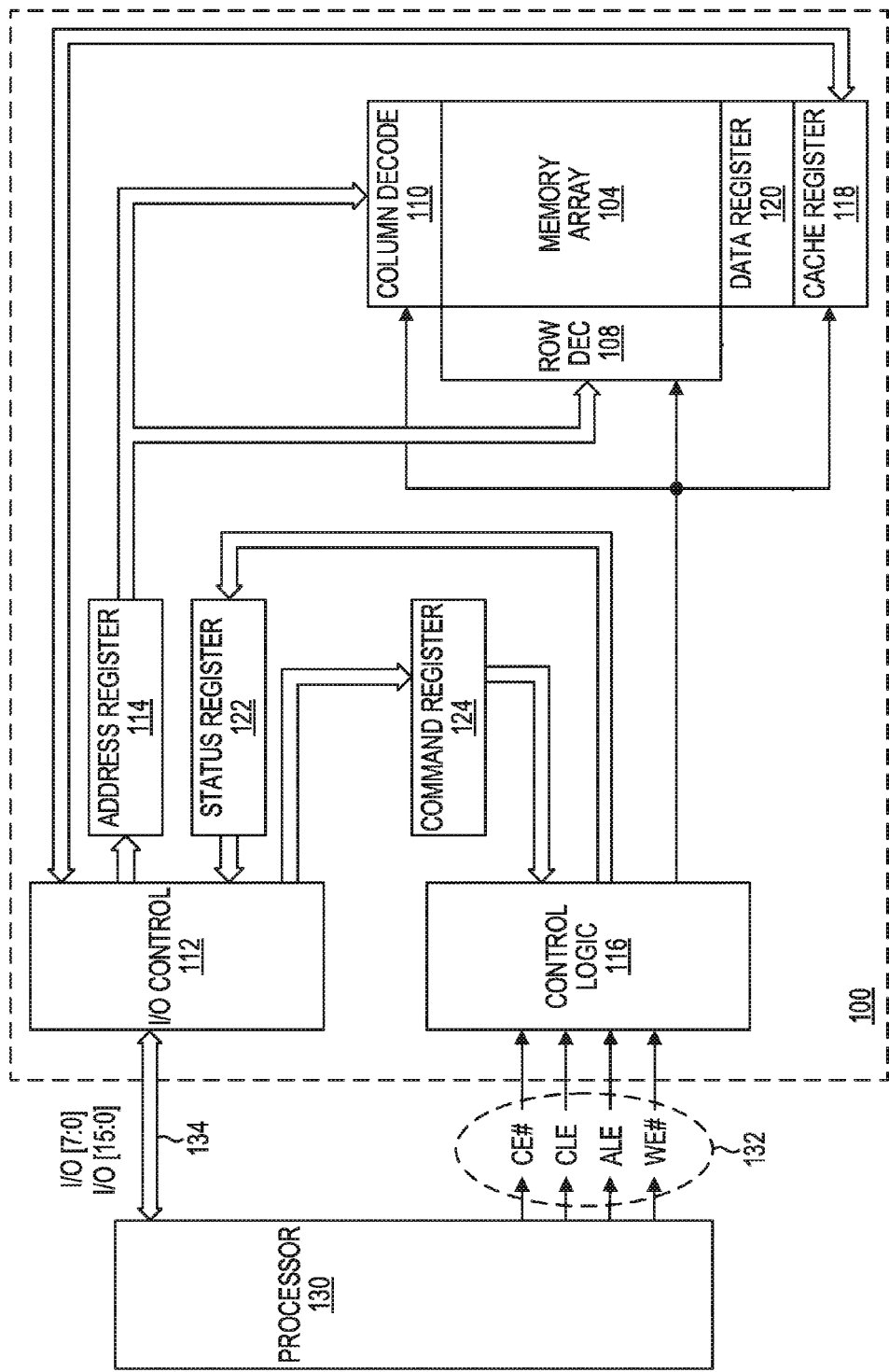
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

In flash memory devices, charge storage in data-storage structures of neighboring memory cells may inadvertently change the functional threshold voltage Vt of the selected memory cell, particularly if several neighboring memory cells are in a programmed state. Accordingly, this disclosure describes embodiments of one pass threshold voltage Vt pre-compensation programming operations (e.g., a programming operation including a program verify operation using at least one intermediate verify and a program verify for a verified data state) in flash memory devices employing aggressor bits from a non-selected aggressor memory cell to pre-compensate the Vt of selected memory cells for effects of neighboring aggressor memory cells. In one example, the flash memory devices might have a stepped sensing architecture.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. Processor 130, e.g., a controller external to memory device 100, may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses, and data to memory device 100 as well as output of data and status information from memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for external processor 130, i.e., control logic 116 is configured to perform access operations in accordance with embodiments described herein. Control logic 116 is in communication with row decode circuitry 108 and column decode circuitry 110 to control row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from cache register 118 to data register 120 for transfer to the array of memory cells 104; then new data is latched in cache register 118 from I/O control circuitry 112. During a read operation, data is passed from cache register 118 to I/O control circuitry 112 for output to external processor 130; then new data is passed from data register 120 to cache register 118. A status register 122 is in communication with I/O control circuitry 112 and control logic 116 to latch the status information for output to processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
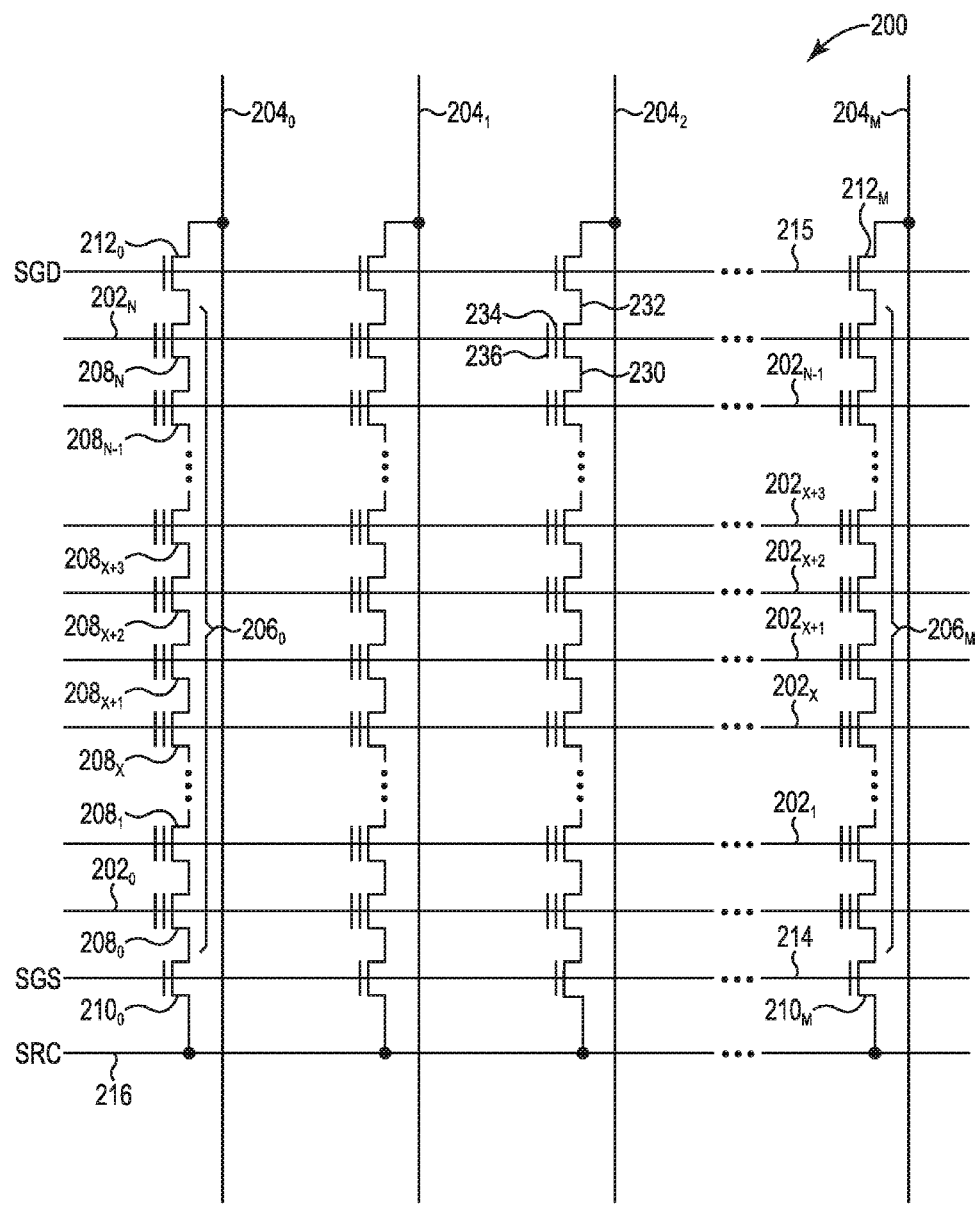
FIG. 2 is a schematic diagram of a portion of an array of memory cells as could be used in a memory device of the type described with reference to FIG. 1.

FIG. 2 is a schematic diagram of one embodiment of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be coupled to global access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where common source 216, strings 206 and bit lines 204 extend in substantially parallel planes. Alternatively, the memory array in FIG. 2 might be a three-dimensional memory array, e.g., where strings 206 may extend substantially perpendicular to a plane containing common source 216 and to a plane containing bit lines 204 that may be substantially parallel to the plane containing common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2. The source 230 and drain 232 of memory cells 208 may have the same composition as a substrate (e.g., semiconductor substrate) upon which the memory cells 208 are formed. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$ $204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 2 is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Source 230 and drain 232 of memory cells 208 might be formed in a substrate, such as a semiconductor material. Data storage structure 234 (e.g., a floating gate, charge trap, etc.) may be isolated from a substrate (e.g., semiconductor substrate) upon which the memory cell 208 is formed, and from the control gate 236, by insulating material. For example, the data-storage structure 234 might be fabricated as a conductor (e.g., a metal or conductive polysilicon) embedded within an insulating material (e.g., silicon oxide (SiO2) or other dielectric) between the substrate and the control gate 236, or it might be fabricated as a discrete conductor between a first insulating material (e.g., a gate dielectric) adjacent the substrate and a second insulating material (e.g., an integrate dielectric) adjacent the control gate 236. In this manner, data-storage structure 234 is not directly electrically coupled to another conductive element of the memory cell 208, but is floating in or between insulating material.

In an example operation, data-storage structure 234 implemented as a floating gate floating gate may be able to store a charge due to its electrical isolation from other components of memory cells 208. Programming or erasing a charge level on the floating gate may be performed via a tunneling process known as Fowler-Nordheim tunneling, in which electrons tunnel through the insulating layer separating the floating gate from the substrate.

To program (e.g., write) a selected NAND flash memory cell 208, source 230 and drain 232 of the memory cell may be brought to a reference potential (e.g., ground, or Vss), and control gate 236 may be brought to a high voltage (e.g., 16V-20V). To perform an example program operation in the selected memory cell 208, the corresponding bit line 204 and the common source 216 might be brought to the reference potential via select transistors 212 and 210, respectively, thereby coupling the corresponding NAND string 206 to the corresponding grounded bit line 204 and grounded common source 216. The control gates of select transistors 212 and 210 may therefore be coupled to a voltage source via drain select line 215 and source select line 214, respectively, such that the select transistors conduct. The control gates 236 of the unselected memory cells 208 not being written are brought to a sufficiently high voltage to cause the unselected memory cells 208 to conduct irrespective of their stored charges (e.g., 10V). The control gate 236 of the selected memory cell 208 might be coupled to a significantly higher voltage (e.g., 16V-20V). The voltage applied to the control gate 236 of the selected memory cell 208 might cause formation of an inversion region in the channel and tunneling of electrons due to the attraction of electrons to the positively charged control gate coupled to the higher voltage (e.g., 16V-20V). The grounded source 230 and drain 232 of the selected memory cell 208 in combination with the inversion region in the channel material may provide a continuous source of electrons for tunneling in the selected memory cell 208's inversion region, such that electrons that tunnel onto the data-storage structure 234 can be replaced by electrons from the corresponding grounded bit line 204 and grounded common source 216.

In one example of a one-pass programming sequence, after programming selected page(s) corresponding to a selected word line 202 of flash memory cells 208, a program verify operation might be performed to confirm that the data state was successfully programmed into the selected page(s) of flash memory cells. If one or more memory cells of the programmed page(s) fails program verification, the program and verify cycle may be repeated until the data state is successfully programmed or a selected number of iterations have passed and the programming operation is deemed to have failed.

To erase a selected NAND flash memory cell 208, source 230 and drain 232 may be left floating, but the substrate material may be brought to a high positive voltage (e.g., 16V-20V), attracting the negatively charged electrons and causing them to tunnel from data-storage structure 234 (e.g., implemented as a floating gate) through the insulating layer to the substrate material. This example erase memory operation is sometimes referred to as channel erase, because the channel substrate material receives electrons from the floating gate.

To perform an example read operation (or a program verify operation) in a selected NAND flash memory cell 208, a given word line 202 and therefore control gate 236 of the selected memory cell 208 may be maintained at a low but positive voltage level while the word lines 202 of unselected memory cells 208 may be brought to a sufficiently high voltage to cause the unselected memory cells 208 to conduct irrespective of any charge that may be on the data-storage structure 234 of the individual unselected memory cells 208. If the selected memory cell 208 has an uncharged data-storage structure 234, the selected memory cell 208 might activate as a result of the low positive voltage level on control gate 236. If the data-storage structure 234 has a negative charge, it might raise the threshold voltage of the selected memory cell 208 above the low positive voltage applied to control gate 236 such that the selected memory cell 208 does not conduct. The state of the data-storage structure 234 of the selected memory cell 208 may therefore be determined by sensing conductivity or current flow between the corresponding bit line 204 and the common source 216.

As electrons tunnel through the oxide layer onto data-storage structure 234, the data-storage structure's initial positive potential due to electric field coupling with control gate 236 might reduce, thereby reducing the voltage difference between data-storage structure 234 and the conducting inversion region in the channel and slowing the tunneling of electrons onto data-storage structure 234. Storage of electrons on data-storage structure 234 is therefore somewhat self-limiting, and might be defined by factors such as electric field coupling between control gate 236 and data-storage structure 234, dielectric (e.g., oxide) thickness, variations in word line 202 voltage or bit line 204 voltage, and stray electric fields or capacitance with other elements of memory device 100. The resulting variation in data-storage structure 234 charge might result in variation in threshold voltage Vt of the written memory cells 208, which is undesirable due to the effect of variation in memory cell 208 reliability and power consumption.

Charge storage in data-storage structures 234 of neighboring memory cells 208 may also inadvertently change the functional threshold voltage of a memory cell 208, particularly if several neighboring memory cells 208 are in a programmed state. When combined with other factors, such as capacitive coupling, temperature fluctuations, program/erase cycling, and storage of multiple bits of data per memory cell 208, the influence of neighboring data-storage structures 234 may cause a memory cell 208 to be misread. The influence is typically strongest for memory cells 208 that are physically near a memory cell 208 to be read or programmed, such as memory cells 208 within one cell's distance in any direction from the cell memory 208 being read or programmed.

Subsets of memory cells 208 coupled to a selected word line 202 may be programmed (e.g., written) and/or sensed (e.g., read) together at the same time. A program operation (e.g., a write operation) might include applying a number of program pulses (e.g., 16V-20V) to a selected word line 202 in order to increase the threshold voltage Vt of selected memory cells 208 coupled to that selected word line 202 to a desired program voltage level corresponding to a target (e.g., desired) data state. A sense operation, such as a read operation or program verify operation, might include sensing a voltage and/or current change of a bit line 204 coupled to a selected memory cell 208 in order to determine the data state of the selected memory cell 208. The sense operation might include providing a voltage to (e.g., biasing) a bit line 204 associated with a selected memory cell 208 above a voltage (e.g., bias voltage) provided to common source 216 associated with the selected memory cell 208. A sense operation might alternatively include pre-charging the bit line 204 followed with discharge when a selected memory cell 208 begins to conduct, and sensing the discharge.

Sensing the data state of a selected memory cell 208 might include providing a number of stepped sensing signals (e.g., stepped sensing signals that include different read voltage levels) to a selected word line 202 while providing a number of pass signals (e.g., read pass voltages) to the word lines 202 coupled to the unselected memory cells 208 of the NAND 206 string sufficient to place the unselected memory cells in a conducting state independent of the Vt of the unselected memory cells. The bit line 204 corresponding to the selected memory cell 208 being read and/or verified may be sensed to determine whether or not the selected memory cell conducts in response to the particular sensing voltage applied to the selected word line 202. For example, the data state of the selected memory cell 208, may be determined based on the current of the bit line 204.

Figure 3:
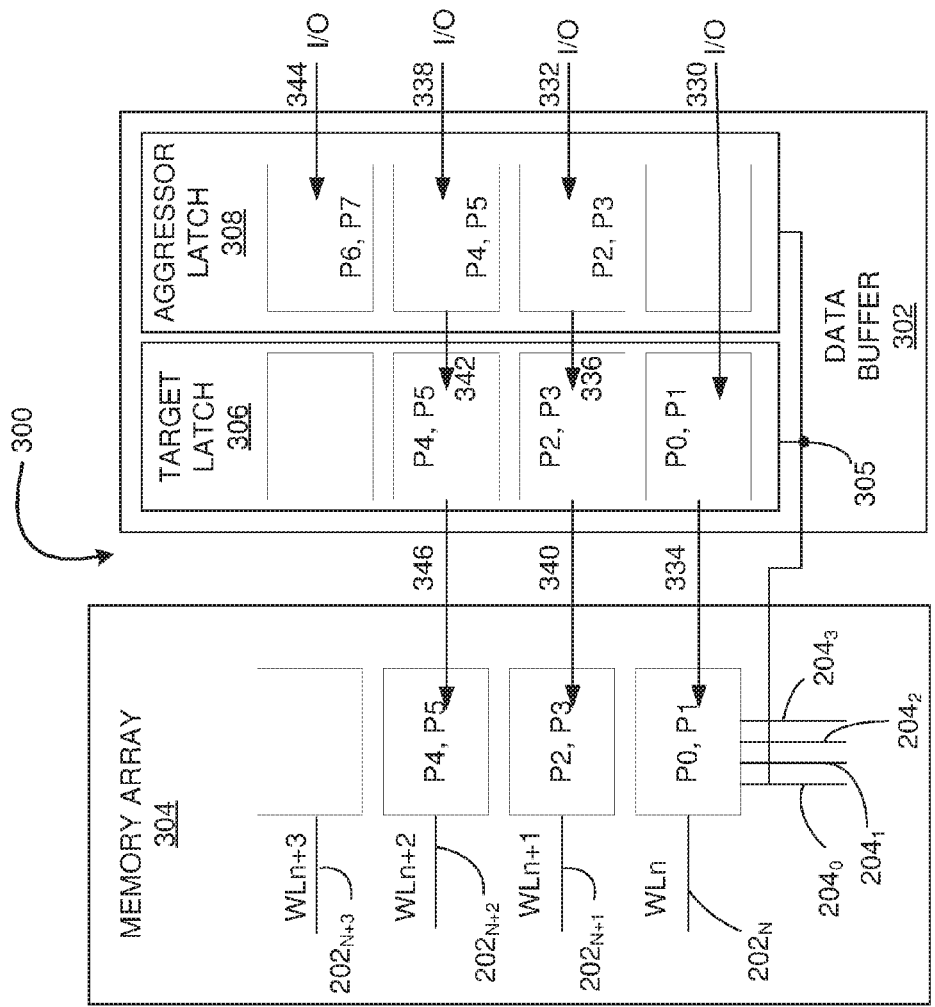
FIG. 3 is a simplified block diagram of one embodiment of a memory device illustrating a portion of an example one pass threshold voltage Vt pre-compensation programming operation.

FIG. 3 illustrates a portion of an example program (e.g., write) operation in an example memory device 300, which may be similar to memory device 100 described above with reference to FIGS. 1-2. Memory device 300 includes a data buffer 302 which may be implemented as a page buffer. Memory device 300 might include a NAND memory array 304 of multi-level cells (MLC). In another embodiment, memory device 300 might include a NAND memory array 304 of a combination of MLC and single-level cell (SLC) memory cells. Memory device 300 may be implemented with rows of memory cells divided into one or more groups of physical pages of memory cells, where physical pages of memory cells might include selective memory cells commonly coupled to a given word line 202. For example, memory cells commonly coupled to word line $202_N$ may be selectively coupled to bit lines 204 corresponding to a lower page (e.g., P0) of memory cells while memory cells commonly coupled to word line $202_N$ may be selectively coupled to bit lines 204 corresponding to an upper page (e.g., P1) of memory cells. For example, memory cells commonly coupled to word line $202_{N+1}$ may be selectively coupled to bit lines 204 corresponding to a lower page (e.g., P2) of memory cells while memory cells commonly coupled to word line $202_{N+1}$ may be selectively coupled to bit lines 204 corresponding to an upper page (e.g., P3) of memory cells. For example, memory cells commonly coupled to word line $202_{N+2}$ may be selectively coupled to bit lines 204 corresponding to a lower page (e.g., P4) of memory cells while memory cells commonly coupled to word line $202_{N+2}$ may be selectively coupled to bit lines 204 corresponding to an upper page (e.g., P5) of memory cells.

During the example program operation, control logic (e.g., control logic 116 shown in FIG. 1) controls transfer of data from I/O control circuitry (e.g., I/O control circuitry 112 shown in FIG. 1) to data buffer 302. At 330, a first I/O transfer occurs in which page P0 data and page P1 data are passed from the I/O control circuitry to a target data latch 306 of data buffer 302. At 332, a second I/O transfer occurs in which page P2 data and page P3 data are passed from the I/O control circuitry to an aggressor data latch 308 of data buffer 302. At 334, a one pass threshold voltage Vt pre-compensation programming operation (including a program verify operation using three intermediate verify and a program verify) is performed to program page P0 data and page P1 data from target data in target data latch 306 to NAND memory array 304 in the selected MLC memory cells corresponding to word line $202_N$ in which page P2 data and page P3 data from aggressor data latch 308 are employed in the program verify operation as aggressor bits to pre-compensate the threshold voltage Vt of the selected memory cells for effects of neighboring aggressor memory cells.

Data buffer 302 includes a data node 305 coupled to at least one data line (e.g., at least one of bit lines 204) in memory array 304. Data node 305 is coupled to target data latch 306 and aggressor data latch 308. The program verify operation is performed for the target data state in target data latch 306 to determine if the selected memory cells are verified for the target data state. In this example, the program verify operation comprises multiple (e.g., three or less than three or greater than three) intermediate verifies, each intermediate verify corresponding to an amount of aggression to apply a data node voltage to data node 305 when performing each intermediate verify, based on two bits of the second target state stored in aggressor data latch 308. In this example, the program verify operation also comprises the program verify corresponding to a condition of no aggression to apply to the data node voltage to data node 305 when performing the program verify, based on the two bits of the second target state stored in aggressor data latch 308. Embodiments of the present disclosure are not limited to two aggressor bits stored in the aggressor data latch. For example, embodiments may include one aggressor bit stored in the aggressor data latch or three or more aggressor bits stored in the aggressor data latch.

In this example, the selected memory cells are inhibited from further programming if the selected memory cells are verified during one of the intermediate verifies and the two bits in aggressor data latch 308 corresponds to the particular amount of aggression, or the selected memory cells are verified during the program verify and the two bits in aggressor data latch 308 corresponds to the condition of no aggression.

At 336, page P2 data and page P3 data are shifted from aggressor data latch 308 to target data latch 306 in data buffer 302. At 338, a third I/O transfer occurs in which page P4 data and page P5 data are passed from the I/O control circuitry to aggressor data latch 308. At 340, a one pass Vt pre-compensation programming operation (including a program verify operation using three intermediate verifies and a program verify) is performed to program page P2 data and page P3 data from target data latch 306 to NAND memory array 304 in selected MLC memory cells corresponding to word line $202_{N+1}$ in which page P4 data and page P5 data from aggressor data latch 308 are employed in the program verify operation as aggressor bits to pre-compensate Vt of the selected memory cells for effects of neighboring aggressor memory cells.

At 342, page P4 data and page P5 data are shifted from aggressor data latch 308 to target data latch 306 in data buffer 302. At 344, a fourth I/O transfer occurs in which page P6 data and page P7 data are passed from the I/O control circuitry to aggressor data latch 308. At 346, a one pass Vt pre-compensation programming operation (including a program verify operation using three intermediate verifies and a program verify) is performed to program page P4 data and page P5 data from target data latch 306 to NAND memory array 306 in selected MLC memory cells corresponding to word line $202_{N+2}$ in which page P6 data and page P7 data from aggressor data latch 308 are employed in the program verify operation as aggressor bits to pre-compensate Vt of the selected memory cells for effects of neighboring aggressor memory cells.

Figure 4:
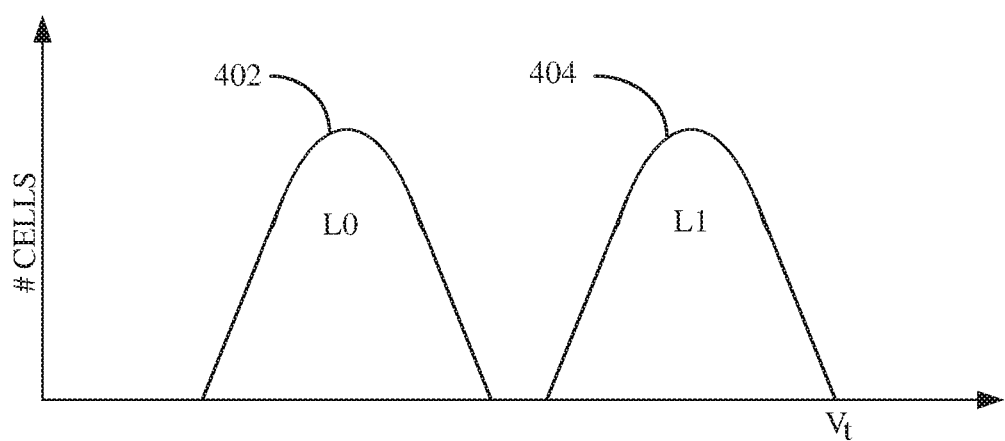
FIG. 4 is a diagram illustrating example threshold voltage distributions, sensing voltages, and data assignments associated with a sensing operation in a memory device.

FIG. 4 illustrates example threshold voltage (Vt) distributions, sensing voltages, and data state assignments associated with a sensing operation in a memory device (e.g., memory device 100, memory device 300). The two example Vt distributions 402 and 404 illustrated in FIG. 4 may correspond to two of four Vt distributions for two-bit (e.g., four-state) MLC memory cells 208 that might have the following four data states: level 0 (L0) 11; level 1 (L1) 01; level 2 (L2) 00; and level 3 (L3) 10. Example Vt distribution 402 corresponds to data state L0 (11), and example Vt distribution 404 corresponds to data state L1 (01). The two additional Vt distributions corresponding to data state L2 (00) and data state (L3) (10) are not shown in FIG. 4. Embodiments of the present disclosure are not limited to two-bit memory cells having four data states. For example, embodiments may include three-bit memory cells having eight data states, four-bit memory cells having 16 data states, or more than four-bit memory cells having more than 16 data states.

Example Vt distributions 402 and 404 represent two of four target data states (e.g., L0 and L1, respectively) to which MLC memory cells 208 may be programmed. In one example, all of the bits of the target data state might be programmed in the selected memory cells in a one pass threshold voltage Vt pre-compensation programming operation (including a program verify operation using three intermediate verifies and a program verify) employing aggressor bits from a non-selected aggressor memory cell 208 to pre-compensate the threshold voltage Vt of the selected memory cells for effects of neighboring aggressor memory cells. Each target data state may have a lower page data value and an upper page data value. In this example, data state L0 (11) (e.g., a lower page data value of 1 and an upper page data value of 1) and data state L1 (01) (e.g., a lower page data value of 1 and an upper page data value of 0). That is, the data values of the upper pages of target states L0 and L1 may be 1 and 0, respectively. The data values of the lower pages of target states L0 and L1 may be each 1. Embodiments of the present disclosure, however, are not limited to these particular data assignments.

Example Vt distributions 402 and 404 may represent a number of MLC memory cells 208 that are programmed to corresponding target states (e.g., L0 and L1, respectively), with the height of a Vt distribution curve indicating a number of memory cells 208 programmed to a particular voltage within the Vt distribution (e.g., on average). The width of the Vt distribution curve indicates the range of voltages that represent a particular target state (e.g., the width of the Vt distribution curve 404 for L1 represents the range of voltages that correspond to a data value of 01).

During an example sense (e.g., read or program verify) operation, a sensing (e.g., read) voltage located between example Vt distributions 402 and 404 might be employed to distinguish between states L0 and L1. In a read or program verify operation performed on a selected memory cell 208 in a NAND string 206, the unselected memory cells 208 of the string 206 may be biased with a pass voltage so as to be in a conducting state. When all memory cells in a NAND string 206 are in a conductive state, current can flow between the source contact at one end of the string and a drain line contact at the other end of the string. As such, the data state of the selected memory cell 208 can be determined based on the current sensed on a bit line 204 corresponding to a particular NAND string 206 when the selected memory cell 208 begins to conduct (e.g., in response to the particular read voltage applied to the control gate of the memory cell (via a selected word line)).

FIGS. 5A-5D illustrate an embodiment of a portion of a one pass threshold voltage Vt pre-compensation programming operation of a NAND memory device 300. In one example, NAND memory device 300 might have a stepped sensing architecture. The one pass threshold voltage Vt pre-compensation programming operation might include a program verify operation using multiple (e.g., three or less than three or greater than three) intermediate verifies and a program verify employing aggressor bits from a non-selected aggressor memory cell 208 to pre-compensate the threshold voltage Vt of the selected memory cells for effects of neighboring aggressor memory cells.

FIGS. 5A-5D illustrate four example aggressor conditions for the example one pass Vt pre-compensation programming operation performed to program page P0 data and page P1 data from target data latch 306 of data buffer 302 to NAND memory array 304 in selected MLC memory cells 208 corresponding to word line $202_N$ in which page P2 data and page P3 data from aggressor data latch 308 of data buffer 302 are employed in the program verify operation as aggressor bits to pre-compensate the threshold voltage Vt of the selected memory cells 208 for effects of neighboring aggressor memory cells. In this example, the target data state of the selected MLC memory cell 208 corresponding to word line $202_N$ and bit line $204_O$, is L1 (01) which is stored in target data latch 306.

In this example, the one pass Vt pre-compensation programming operation includes the program verify operation in which three intermediate verifies (e.g., pre-verifies) are performed in addition to a program verify (e.g., a standard program verify) for each of data state levels: L0 (11); L1 (01); L2 (00); and L3 (10). This is in contrast to typical conventional NAND flash memories having standard program verify operations that only perform the standard program verify for each data state level.

The program verify operation is performed for the target data state in target data latch 306 to determine if the selected memory cells are verified for the target data state. In this example, the program verify operation comprises: three intermediate verifies, each intermediate verify corresponding to an amount of aggression to apply the data node voltage to data node 305 when performing each intermediate verify, based on two bits of the second target state stored in aggressor data latch 308; and the program verify corresponding to a condition of no aggression to apply to the data node voltage to data node 305 when performing the program verify, based on the two bits of the second target state stored in aggressor data latch 308.

In this example, the selected memory cells are inhibited from further programming if the selected memory cells are verified during one of the intermediate verifies and the two bits in aggressor data latch 308 corresponds to the particular amount of aggression, or the selected memory cells are verified during the program verify and the two bits in aggressor data latch 308 corresponds to the condition of no aggression.

The amount of aggression (nδ) for pre-compensation might be defined by the target data state of the selected MLC memory cell 208 corresponding to word line $202_{N+1}$ and bit line $204_O$, which is stored as aggressor bits in aggressor data latch 308 as follows. In general, aggressor bits corresponding to higher data states (e.g., higher threshold voltages) may correspond to higher amounts of aggression, and a number of defined levels of aggression for various embodiments might be an integer value between 1 and DS−1, where DS is a number of data states that may be represented by the aggressor memory cell. For certain embodiments, the number of defined levels of aggression might be an integer value equal to $2^B-1$, where B is the number of aggressor bits.

In example amounts of aggression (−nδ), δ may be a constant. δ might be determined theoretically from the structure and materials of the memory array, or empirically from measurements of similar memory arrays, for the particular voltage levels of the various data states. In some embodiments, the higher amounts of aggression might not be multiples of a first amount of aggression. In some embodiments, each amount of aggression might be determined independently.

FIGS. 6A-6D illustrate example boosted analog data node voltages of data node 305 for an example data state L1 (01). Data node 305 is boosted by a program verify voltage (PV) adjusted by an aggression amount (nδ) (e.g., (PV−nδ)) based on the two bits (i.e., aggressor bits) of the second target state stored in the aggressor data latch.

Figure 5A:
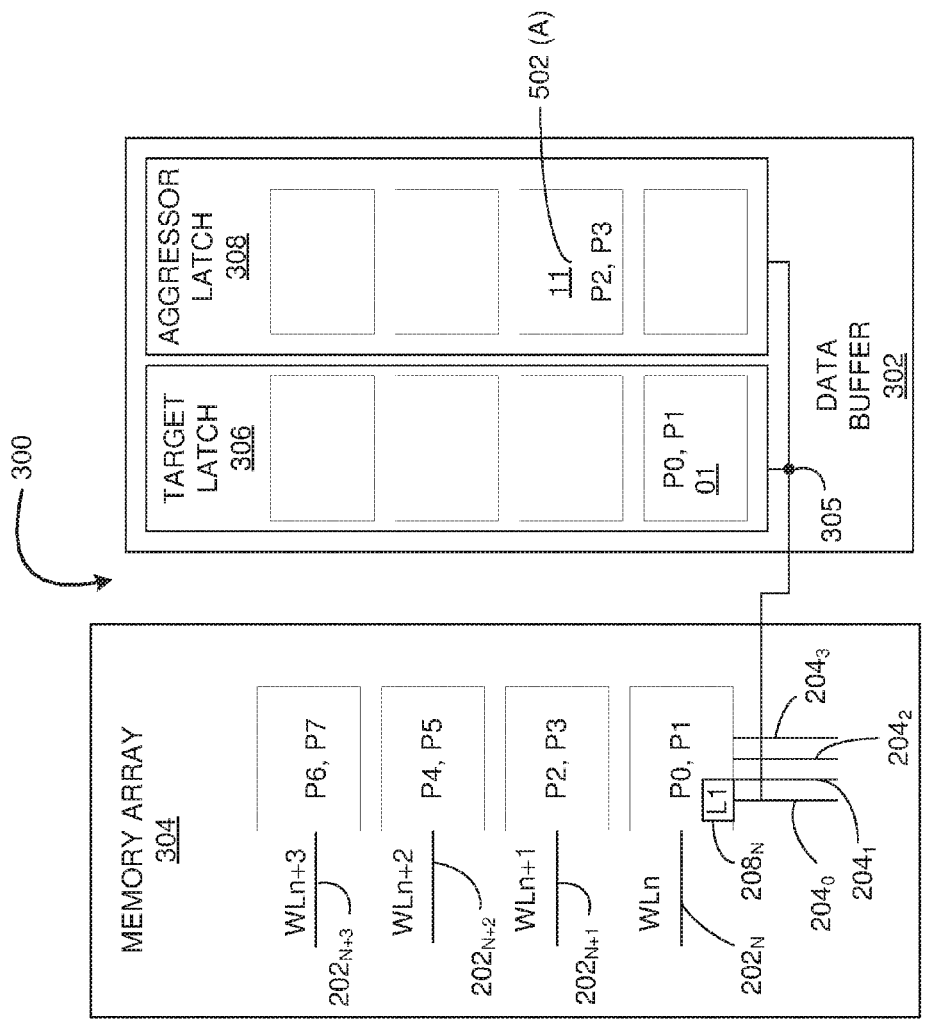
FIGS. 5A-5D are diagrams illustrating one embodiment of a portion of a one pass threshold voltage pre-compensation programming operation of a memory device.

In FIG. 5A, at 502, condition A may have aggressor bits in aggressor data latch 308 at 11 to define no aggression (0δ). In this case, the program verify is performed corresponding to a condition of no aggression to apply a program verify voltage (PV) to data node 305 (as illustrated at 602 in FIG. 6A). In this case, the selected memory cells are inhibited from further programming if the selected memory cells are verified during the program verify and the aggressor bits in aggressor data latch 308 are at 11 corresponding to the condition of no aggression.

Figure 5B:
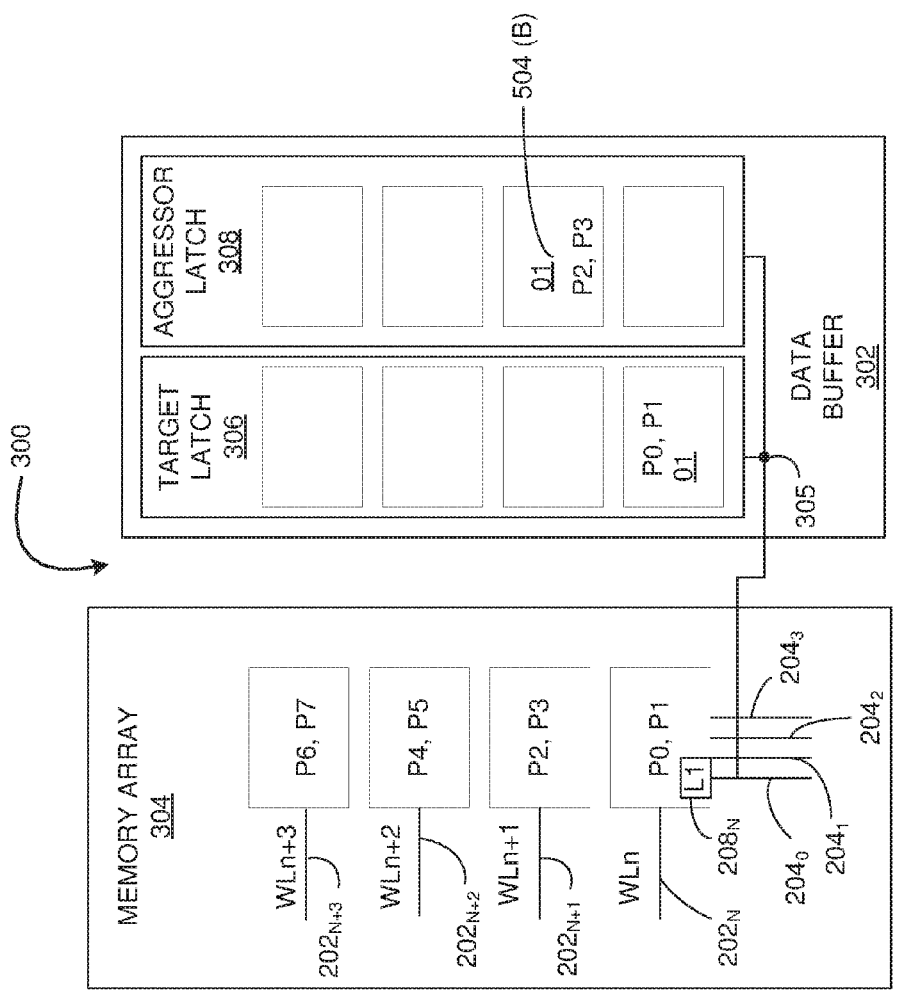

In FIG. 5B, at 504, condition B may have aggressor bits in aggressor data latch 308 at 01 to define low aggression (−1δ). In this case, an intermediate verify is performed corresponding to a condition of low aggression to apply a program verify voltage minus the low amount of aggression (PV−1δ) to data node 305 (as illustrated at 604 in FIG. 6B). In this case, the selected memory cells are inhibited from further programming if the selected memory cells are verified during the intermediate verify and the aggressor bits in aggressor data latch 308 are at 01 corresponding to the low amount of aggression (−1δ).

Figure 5C:
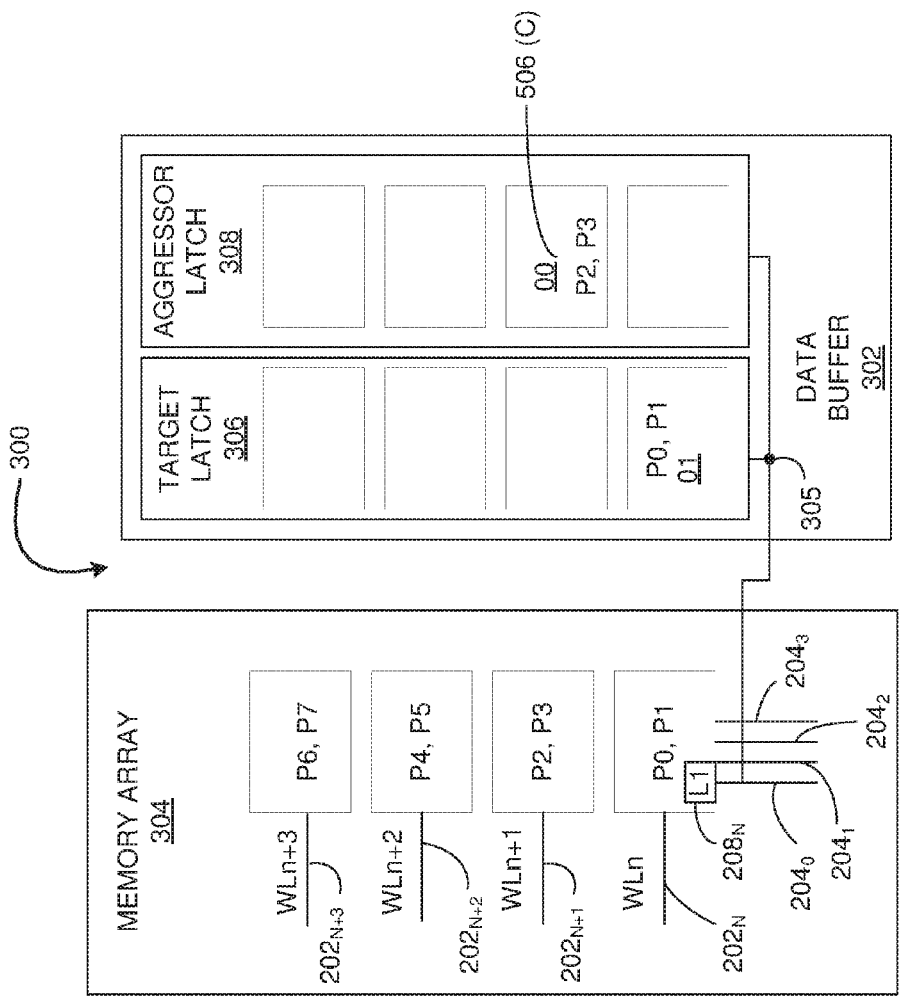

In FIG. 5C, at 506, condition C may have aggressor bits in aggressor data latch 308 at 00 to define medium aggression (−2δ). In this case, an intermediate verify is performed corresponding to a condition of medium aggression to apply a program verify voltage minus the medium amount of aggression (PV−2δ) to data node 305 (as illustrated at 606 in FIG. 6C). In this case, the selected memory cells are inhibited from further programming if the selected memory cells are verified during the intermediate verify and the aggressor bits in aggressor data latch 308 are at 00 corresponding to the medium amount of aggression (−2δ).

Figure 5D:
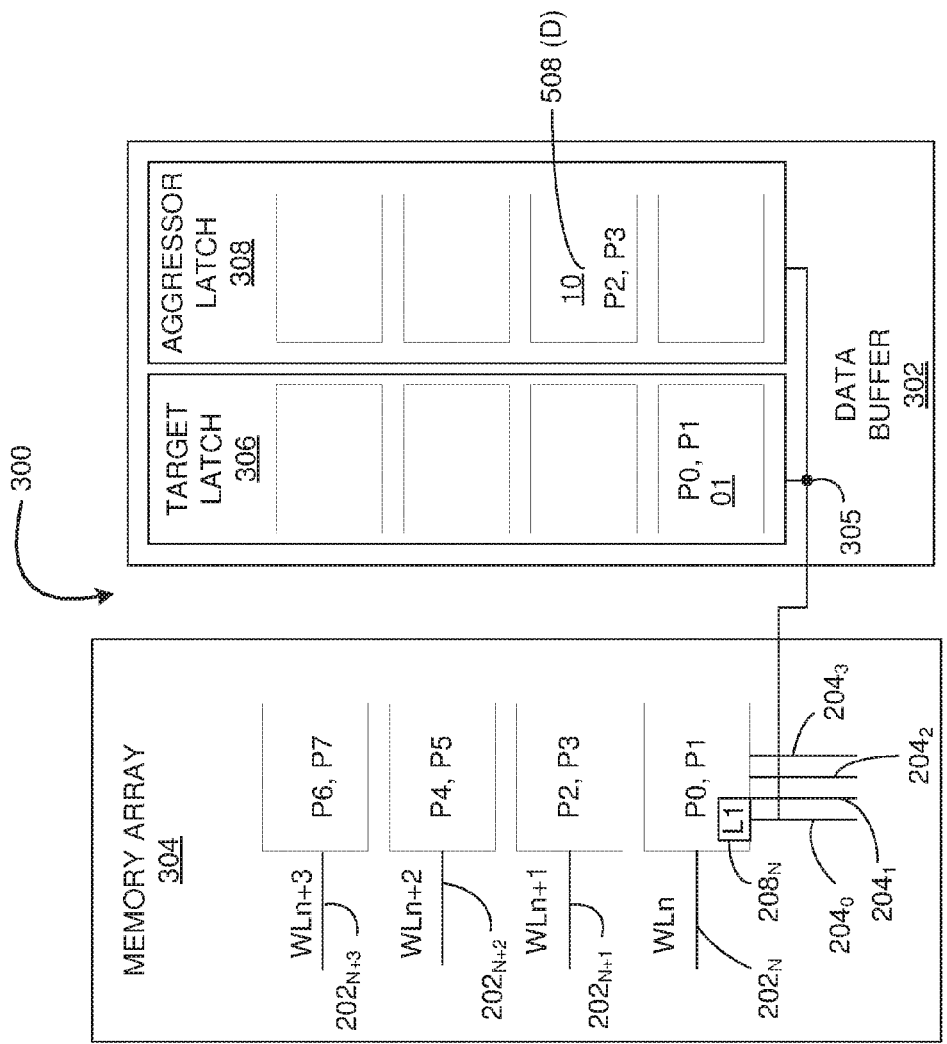
Figure 6A:
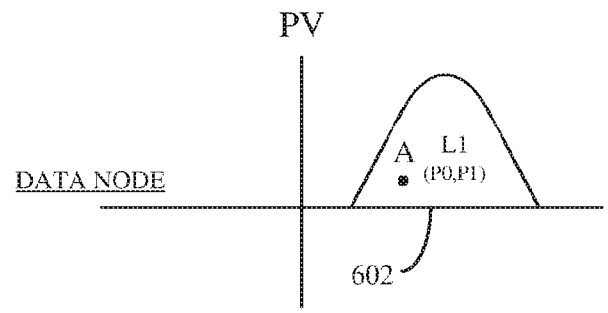
FIGS. 6A-6D are diagrams illustrating one embodiment of example boosted analog data node voltages of an example data node for an example data state based on two aggressor bits stored in an aggressor data latch in a memory device.
Figure 6B:
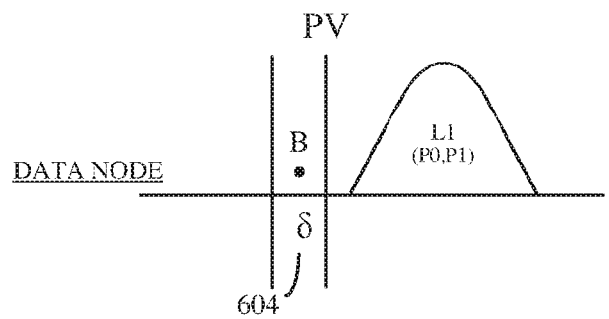
Figure 6C:
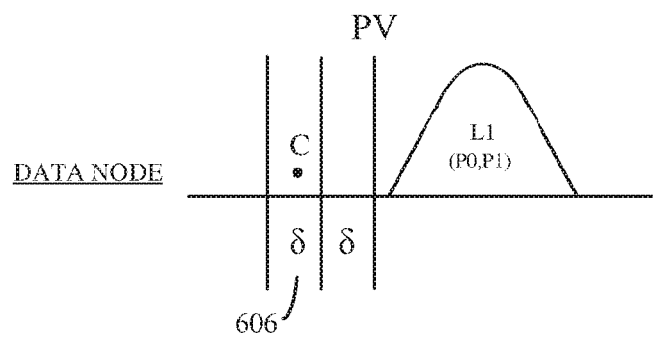
Figure 6D:
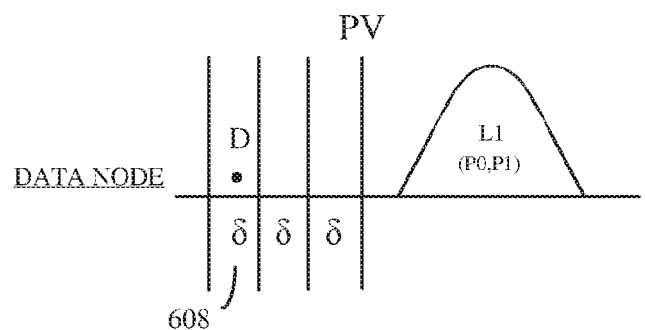

In FIG. 5D, at 508, condition D may have aggressor bits in aggressor data latch 308 at 10 to define high aggression (−3δ). In this case, an intermediate verify is performed corresponding to a condition of high aggression to apply a program verify voltage minus the high amount of aggression (PV−3δ) to data node 305 (as illustrated at 608 in FIG. 6D). In this case, the selected memory cells are inhibited from further programming if the selected memory cells are verified during the intermediate verify and the aggressor bits in aggressor data latch 308 are at 10 corresponding to the high amount of aggression (−3δ).

Figure 7:
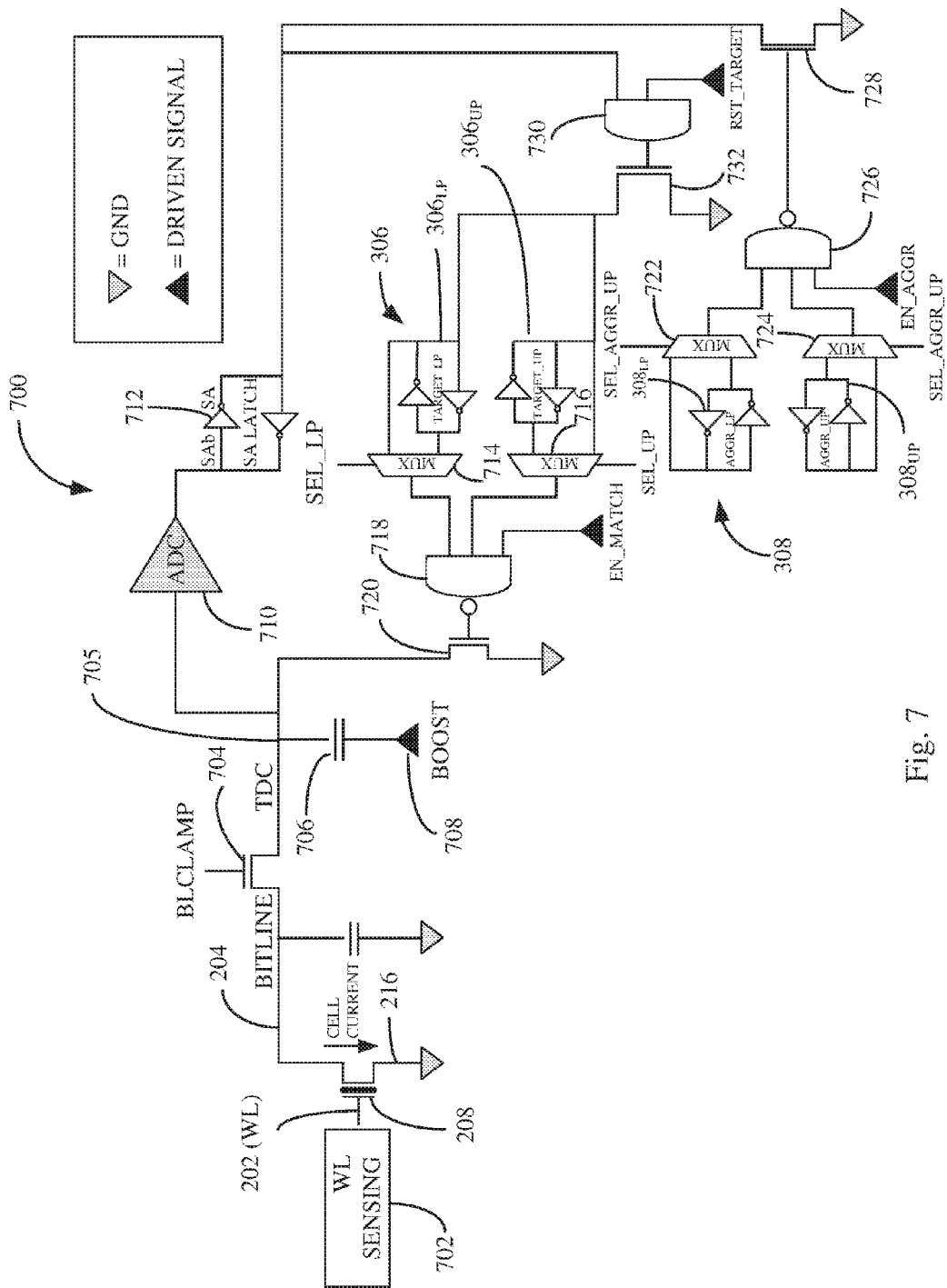
FIG. 7 is a schematic diagram illustrating one embodiment of a portion of a memory device.

FIG. 7 is a schematic diagram of a portion of one embodiment of a memory device 700 including a memory cell 208 to be programmed in an example one pass threshold voltage pre-compensation programming operation including an example program verify operation. Memory cell 208 may be coupled in a NAND memory array similar to NAND memory array 200 illustrated in FIG. 2. The example program verify operation may employ two aggressor bits and include a program verify and three intermediate verifies performed for each of the four data state levels (e.g., L0 (11), L1 (01), L2 (00), and L3 (10)) as part of the example one pass threshold voltage Vt pre-compensation programming operation that programs both bits of the target data state in the selected memory cells 208. The example program verify operation might be performed after programming the selected pages corresponding to a selected word line 202 of flash memory cells 208.

Target latch 306 may include a lower page target latch $306_{LP}$ and an upper page target latch $306_{UP}$ which might respectively store target data states for programming in the example one pass Vt pre-compensation programming operation and verifying programming (in the example program verify operation) of a selected memory cell 208 (e.g., having its control gate coupled to word line $202_N$) having a lower page data value and an upper page data value. In one example, for data state L0 (11) a lower page data value of 1 is stored in lower page target latch $306_{LP}$ and an upper page data value of 1 is stored in upper page target latch $306_{UP}$; for data state L1 (01) a lower page data value of 1 is stored in lower page target latch $306_{LP}$ and an upper page data value of 0 is stored in upper page target latch $306_{UP}$; for data state L2 (00) a lower page data value of 0 is stored in lower page target latch $306_{LP}$ and an upper page data value of 0 is stored in upper page target latch $306_{UP}$; and for data state L3 (10) a lower page data value of 0 is stored in lower page target latch $306_{LP}$ and an upper page data value of 1 is stored in upper page target latch $306_{UP}$.

Aggressor latch 308 may include a lower page aggressor latch $308_{LP}$ and an upper page aggressor latch $308_{UP}$ which might together store two aggressor bits having a lower page value and an upper page value employed in the example program verify operation to pre-compensate the threshold voltage Vt of the selected memory cells 208 for effects of neighboring aggressor memory cells' data states where the two aggressor bits are from the target data state for programming a non-selected aggressor memory cell 208 (e.g., having its control gate coupled to word line $202_{N+1}$). In one example, for data state L0 (11) (e.g., no aggression) a lower page aggressor bit of 1 is stored in lower page aggressor latch $308_{LP}$ and an upper page aggressor bit of 1 is stored in upper page aggressor latch $308_{UP}$; for data state L1 (01) (e.g., min aggression) a lower page aggressor bit of 1 is stored in lower page aggressor latch $308_{LP}$ and an upper page aggressor bit of 0 is stored in upper page aggressor latch $308_{UP}$; for data state L2 (00) (e.g., medium aggression) a lower page aggressor bit of 0 is stored in lower page aggressor latch $308_{LP}$ and an upper page aggressor bit of 0 is stored in upper page aggressor latch $308_{UP}$; and for data state L3 (10) (e.g., max aggression) a lower page aggressor bit of 0 is stored in lower page aggressor latch $308_{LP}$ and an upper page aggressor bit of 1 is stored in upper page aggressor latch $308_{UP}$.

To perform the example program verify operation in a selected memory cell 208, a given word line 202 and therefore the control gate of the selected memory cell 208 may be maintained at a low but positive voltage level while the word lines 202 of unselected memory cells 208 may be brought to a sufficiently high voltage to cause the unselected memory cells 208 to conduct irrespective of any charge that may be on the data-storage structure of the individual unselected memory cells 208. If the selected memory cell 208 has an uncharged data-storage structure, the selected memory cell 208 might activate as a result of the low positive voltage level on its control gate. If the data-storage structure of the selected memory cell 208 has a negative charge, it might raise the threshold voltage of the selected memory cell 208 above the low positive voltage applied to the control gate such that the selected memory cell 208 does not conduct. The state of the data-storage structure of the selected memory cell 208 may therefore be determined by sensing conductivity or current flow between the corresponding bit line 204 and the common source 216.

A word line sensing voltage 702 might be applied to the control gate of memory cell 208. In one example, word line sensing voltage 702 is a fixed sensing voltage for each of the four data state levels (e.g., L0 (11), L1 (01), L2 (00), and L3 (10)). This is referred to as a stepped sensing voltage because it is stepped up for each state level change but remains fixed during the program verify operation (having the program verify and three intermediate verifies) performed for each of the four data state levels.

A bit line clamp transistor 704 is switched on and selected memory cell 208 current flows between bit line 204 and common source 216 and the data state stored in the data-storage structure in selected memory cell 208 is sensed at a data node 705 (e.g., a temporary data cache (TDC) node) as a data node voltage (e.g., an analog TDC node voltage) and stored across a TDC capacitance 706. Bit line clamp transistor 704 is switched off to freeze the TDC node voltage on TDC node 705.

A boost driver 708 controlled by a controller (e.g., an internal controller, such as control logic 116 in FIG. 1 or an external controller such as processor 130 in FIG. 1) may drive a boost value equal to the program verify voltage (PV) (i.e., no aggression condition A illustrated at 602 in FIG. 6) to set the TDC node voltage on TDC node 705 to the frozen TDC node voltage+PV. An analog-to-digital converter (ADC) 710 may convert the analog TDC node voltage on TDC node 705 to a sense amplifier (SA) digital value that is stored in sense amplifier (SA) latch 712. An EN_MATCH signal might be activated via the controller and corresponding SEL_LP signal controlling a LP multiplexer 714 and SEL_UP signal controlling UP multiplexer 716 might be activated via the controller depending on the specific verify data state level to determine via the controller if there is a match between the TDC node voltage on TDC node 705 and the target data state stored in the respective lower page target latch $306_{LP}$ and upper page target latch $306_{UP}$. The EN_MATCH signal and the outputs of multiplexers 714 and 716 are provided to a NAND gate 718 which controls a transistor 720. If there is no match (fail condition), transistor 720 is switched on to discharge the voltage on TDC node 705. If there is a match (pass condition), transistor 720 is switched off and the TDC node voltage on TDC node 705 is maintained at the frozen TDC node voltage+PV. ADC 710 may convert the analog TDC node voltage on TDC node 705 representing the analog pass/fail condition to a SA digital pass/fail value that is stored in SA latch 712.

An EN_AGGR signal might be activated via the controller and corresponding SEL_AGGR_LP signal controlling a LP aggressor multiplexer 722 and SEL_AGGR_UP signal controlling UP aggressor multiplexer 724 might be activated via the controller depending on the specific verify aggression amount to determine via the controller if there is a match between the current aggression amount (in this case no aggression) and the two aggressor bits collectively stored in lower page aggressor latch $308_{LP}$ and upper page aggressor latch $308_{UP}$. The EN_AGGR signal and the outputs of multiplexers 722 and 724 are provided to a NAND gate 726 which controls a transistor 728. If there is no match, transistor 728 is switched on to discharge the SA latch 712 output to set SA to 0. If there is a match, transistor 728 is switched off and the SA latch 712 output is maintained at the current SA digital pass/fail value. Accordingly, in one example, SA is equal to 0 if there is no match or if the SA digital value is fail; and SA is equal to 1 if there is a match and the SA digital value is pass. The output SA of SA latch 712 might represent an inhibit condition.

A RST_TARGET signal and the output SA of SA latch 712 are provided to an AND gate 730 which controls a transistor 732. The RST_TARGET signal is activated via the controller to pass on the inhibit condition represented by SA. If the RST_TARGET signal is activated via the controller and SA is equal to 1, transistor 732 is switched on to discharge lower page target latch $306_{LP}$ and upper page target latch $306_{UP}$ to inhibit further program verifies and further programming of the selected memory cell 208. If the RST_TARGET signal is not activated via the controller or if the RST_TARGET signal is activated via the controller and SA is equal to 0, transistor 732 is switched off to maintain the target data state stored in the respective lower page target latch $306_{LP}$ and upper page target latch $306_{UP}$.

Boost driver 708 via the controller may drive the boost value equal to (PV−1δ) (i.e., low aggression condition B illustrated at 604 in FIG. 6) to set the TDC node voltage at TDC node 705 to the frozen TDC node voltage+(PV−1δ). ADC 710 may convert the analog TDC node voltage to SA digital value that is stored in SA latch 712. The EN_MATCH signal might be activated via the controller and corresponding SEL_LP signal controlling LP multiplexer 714 and SEL_UP signal controlling UP multiplexer 716 might be activated via the controller depending on the specific verify data state level to determine via the controller if there is a match between the TDC node voltage and the target data state stored in the respective lower page target latch $306_{LP}$ and upper page target latch $306_{UP}$. If there is no match (fail condition), transistor 720 is switched on to discharge the voltage on the TDC node. If there is a match (pass condition), transistor 720 is switched off and the TDC node voltage at TDC node 705 is maintained at the frozen TDC node voltage+(PV−1δ). ADC 710 may convert the analog TDC node voltage representing the analog pass/fail condition to a SA digital pass/fail value that is stored in SA latch 712.

The EN_AGGR signal might be activated via the controller and corresponding SEL_AGGR_LP signal controlling LP aggressor multiplexer 722 and SEL_AGGR_UP signal controlling UP aggressor multiplexer 724 might be activated via the controller depending on the specific verify aggression amount to determine via the controller if there is a match between the current aggression amount (in this case low aggression) and the two aggressor bits collectively stored in lower page aggressor latch $308_{LP}$ and upper page aggressor latch $308_{UP}$. If there is no match, transistor 728 is switched on to discharge the SA latch 712 output to set SA to 0. If there is a match, transistor 728 is switched off and the SA latch 712 output is maintained at the current SA digital pass/fail value. Accordingly, in one example, SA is equal to 0 if there is no match or if the SA digital value is fail; and SA is equal to 1 if there is a match and the SA digital value is pass. The output SA of SA latch 712 might represent an inhibit condition.

The RST_TARGET signal is activated via the controller to pass on the inhibit condition represented by SA. If the RST_TARGET signal is activated via the controller and SA is equal to 1, transistor 732 is switched on to discharge lower page target latch $306_{LP}$ and upper page target latch $306_{UP}$ to inhibit further program verifies and further programming of the selected memory cell 208. If the RST_TARGET signal is not activated via the controller or if the RST_TARGET signal is activated via the controller and SA is equal to 0, transistor 732 is switched off to maintain the target data state stored in the respective lower page target latch $306_{LP}$ and upper page target latch $306_{UP}$.

Boost driver 708 via the controller may drive the boost value equal to (PV−2δ) (i.e., medium aggression condition C illustrated at 606 in FIG. 6) to set the TDC node voltage at TDC node 705 to the frozen TDC node voltage+(PV−2δ). ADC 710 may convert the analog TDC node voltage to SA digital value that is stored in SA latch 712. The EN_MATCH signal might be activated via the controller and corresponding SEL_LP signal controlling LP multiplexer 714 and SEL_UP signal controlling UP multiplexer 716 might be activated via the controller depending on the specific verify data state level to determine via the controller if there is a match between the TDC node voltage and the target data state stored in the respective lower page target latch $306_{LP}$ and upper page target latch $306_{UP}$. If there is no match (fail condition), transistor 720 is switched on to discharge the voltage on the TDC node. If there is a match (pass condition), transistor 720 is switched off and the TDC node voltage at TDC node 705 is maintained at the frozen TDC node voltage+(PV−2δ). ADC 710 may convert the analog TDC node voltage representing the analog pass/fail condition to a SA digital pass/fail value that is stored in SA latch 712.

The EN_AGGR signal might be activated via the controller and corresponding SEL_AGGR_LP signal controlling LP aggressor multiplexer 722 and SEL_AGGR_UP signal controlling UP aggressor multiplexer 724 might be activated via the controller depending on the specific verify aggression amount to determine via the controller if there is a match between the current aggression amount (in this case medium aggression) and the two aggressor bits collectively stored in lower page aggressor latch $308_{LP}$ and upper page aggressor latch $308_{UP}$. If there is no match, transistor 728 is switched on to discharge the SA latch 712 output to set SA to 0. If there is a match, transistor 728 is switched off and the SA latch 712 output is maintained at the current SA digital pass/fail value. Accordingly, in one example, SA is equal to 0 if there is no match or if the SA digital value is fail; and SA is equal to 1 if there is a match and the SA digital value is pass. The output SA of SA latch 712 might represent an inhibit condition.

The RST_TARGET signal is activated via the controller to pass on the inhibit condition represented by SA. If the RST_TARGET signal is activated via the controller and SA is equal to 1, transistor 732 is switched on to discharge lower page target latch 306$_{LP}$ and upper page target latch 306$_{UP}$ to inhibit further program verifies and further programming of the selected memory cell 208. If the RST_TARGET signal is not activated via the controller or if the RST_TARGET signal is activated via the controller and SA is equal to 0, transistor 732 is switched off to maintain the target data state stored in the respective lower page target latch 306$_{LP}$ and upper page target latch 306$_{UP}$.

Boost driver 708 via the controller may drive the boost value equal to (PV−3δ) (i.e., high aggression condition D illustrated at 608 in FIG. 6) to set the TDC node voltage at TDC node 705 to the frozen TDC node voltage+(PV−3δ). ADC 710 may convert the analog TDC node voltage to SA digital value that is stored in SA latch 712. The EN_MATCH signal might be activated via the controller and corresponding SEL_LP signal controlling LP multiplexer 714 and SEL_UP signal controlling UP multiplexer 716 might be activated via the controller depending on the specific verify data state level to determine via the controller if there is a match between the TDC node voltage and the target data state stored in the respective lower page target latch 306$_{LP}$ and upper page target latch 306$_{UP}$. If there is no match (fail condition), transistor 720 is switched on to discharge the voltage on the TDC node. If there is a match (pass condition), transistor 720 is switched off and the TDC node voltage at TDC node 705 is maintained at the frozen TDC node voltage+(PV−3δ). ADC 710 may convert the analog TDC node voltage representing the analog pass/fail condition to a SA digital pass/fail value that is stored in SA latch 712.

The EN_AGGR signal might be activated via the controller and corresponding SEL_AGGR_LP signal controlling LP aggressor multiplexer 722 and SEL_AGGR_UP signal controlling UP aggressor multiplexer 724 might be activated via the controller depending on the specific verify aggression amount to determine via the controller if there is a match between the current aggression amount (in this case high aggression) and the two aggressor bits collectively stored in the respective lower page aggressor latch 308$_{LP}$ and upper page aggressor latch 308$_{UP}$. If there is no match, transistor 728 is switched on to discharge the SA latch 712 output to set SA to 0. If there is a match, transistor 728 is switched off and the SA latch 712 output is maintained at the current SA digital pass/fail value. Accordingly, in one example, SA is equal to 0 if there is no match or if the SA digital value is fail; and SA is equal to 1 if there is a match and the SA digital value is pass. The output SA of SA latch 712 might represent an inhibit condition.

The RST_TARGET signal is activated via the controller to pass on the inhibit condition represented by SA. If the RST_TARGET signal is activated via the controller and SA is equal to 1, transistor 732 is switched on to discharge lower page target latch 306$_{LP}$ and upper page target latch 306$_{UP}$ to inhibit further program verifies and further programming of the selected memory cell 208. If the RST_TARGET signal is not activated via the controller or if the RST_TARGET signal is activated via the controller and SA is equal to 0, transistor 732 is switched off to maintain the target data state stored in the respective lower page target latch 306$_{LP}$ and upper page target latch 306$_{UP}$.

The above described example sequence 750 in the example program verify operation has boost driver 708 drive the boost value equal to (PV−nδ) (where −nδ is a current aggression amount) to set the TDC node voltage at TDC node 705 to the frozen TDC node voltage+(PV−nδ) and verifies if there is a match between the current aggression amount (−nδ) and the two aggressor bits stored in aggressor latch 308 in an order of no aggression, low aggression, medium aggression, and high aggression. Other embodiments might have different orders of boosting the TDC node voltage by a current aggression amount and checking the current aggression amount and the two aggressor bits stored in aggressor latch 308 (e.g., an order of high aggression, medium aggression, low aggression, and no aggression or other suitable order).

Figure 8A:
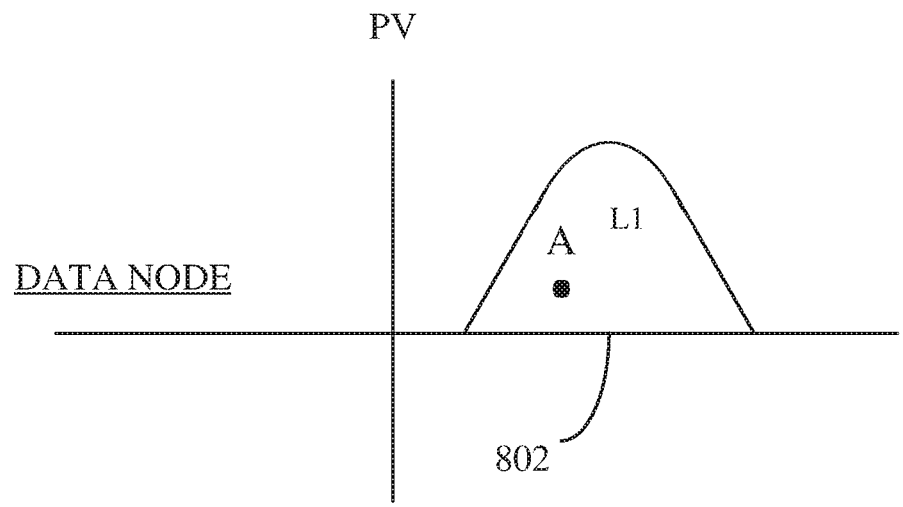
FIGS. 8A-8B are diagrams illustrating one embodiment of example boosted analog data node voltages of an example data node for an example data state based on one aggressor bit stored in an aggressor data latch in a memory device.
Figure 8B:
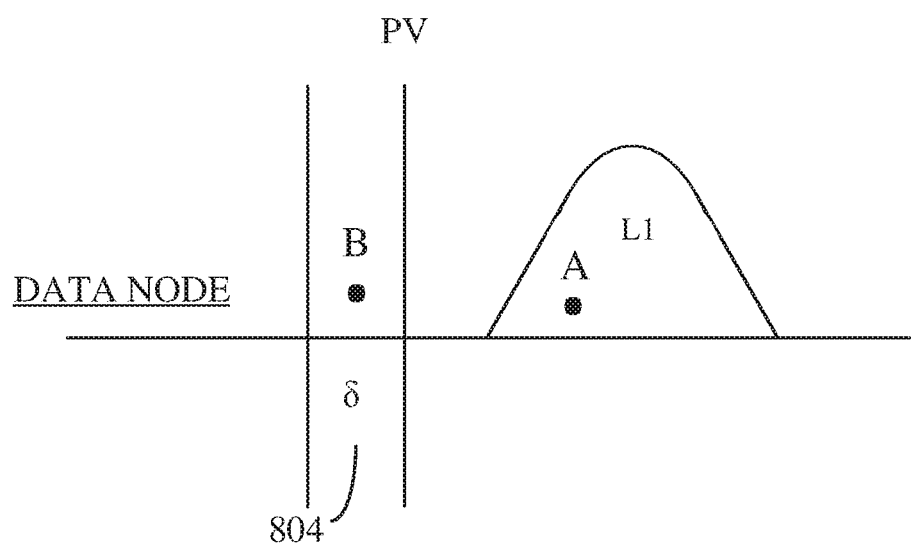

FIGS. 8A-8B illustrate example boosted analog data node voltages of a data node for an example data state L1 (01). The data node is boosted by a program verify voltage (PV) adjusted by an aggression amount (nδ) (e.g., (PV−nδ)) based on one bit (i.e., aggressor bit) of a second target state stored in an aggressor data latch in a data buffer in a memory device.

Figure 9:
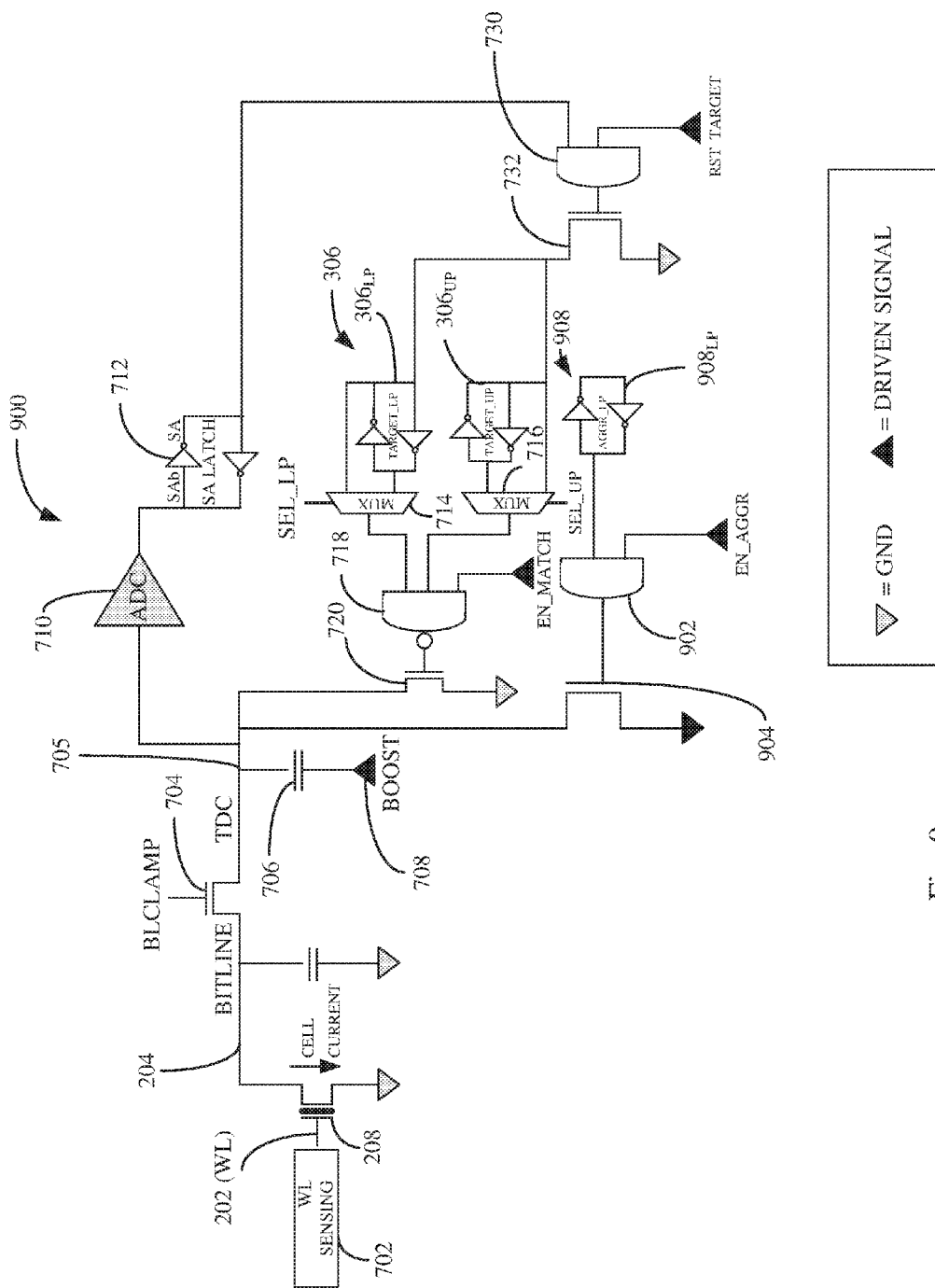
FIG. 9 is a schematic diagram illustrating one embodiment of a portion of a memory device.

FIG. 9 is a schematic diagram of a portion of one embodiment of a memory device 900 including a memory cell 208 to be programmed in an example one pass threshold voltage pre-compensation programming operation including an example program verify operation. Memory cell 208 may be coupled in a NAND memory array similar to NAND memory array 200 illustrated in FIG. 2. The example program verify operation employs one aggressor bit and has a program verify and one intermediate verify performed for each of the four data state levels (e.g., L0 (11), L1 (01), L2 (00), and L3 (10)) as part of the example one pass threshold voltage Vt pre-compensation programming operation that programs both bits of the target data state in the selected memory cells 208. The example program verify operation might be performed after programming the selected pages corresponding to a selected word line 202 of flash memory cells 208.

Target latch 306 may include a lower page target latch 306$_{LP}$ and an upper page target latch 306$_{UP}$ which might respectively store target data states for programming in the example one pass Vt pre-compensation programming operation and verifying programming (in the example program verify operation) of a selected memory cell 208 (e.g., having its control gate coupled to word line 202$_N$) having a lower page data value and an upper page data value. In one example, for data state L0 (11) a lower page data value of 1 is stored in lower page target latch 306$_{LP}$ and an upper page data value of 1 is stored in upper page target latch 306$_{UP}$; for data state L1 (01) a lower page data value of 1 is stored in lower page target latch 306$_{LP}$ and an upper page data value of 0 is stored in upper page target latch 306$_{UP}$; for data state L2 (00) a lower page data value of 0 is stored in lower page target latch 306$_{LP}$ and an upper page data value of 0 is stored in upper page target latch 306$_{UP}$; and for data state L3 (10) a lower page data value of 0 is stored in lower page target latch 306$_{LP}$ and an upper page data value of 1 is stored in upper page target latch 306$_{UP}$.

An aggressor latch 908 may include a lower page aggressor latch 908$_{LP}$ to store one aggressor bit having a lower page value employed in the example program verify operation to pre-compensate the threshold voltage Vt of the selected memory cells 208 for effects of neighboring aggressor memory cells' data states where the one aggressor bit is from the target data state for programming a non-selected aggressor memory cell 208 (e.g., having its control gate coupled to word line 202$_{N+1}$). In one example, for data state L0 (11) or data state L1 (01) (i.e., no aggression), a lower page aggressor bit of 1 is stored in lower page aggressor latch $908_{LP}$; and for data state L2 (00) or data state L3 (10) (i.e., aggression), a lower page aggressor bit of 0 is stored in lower page aggressor latch $908_{LP}$.

The word line sensing voltage 702 might be applied to the control gate of memory cell 208. Bit line clamp transistor 704 is switched on and selected memory cell 208 current flows between bit line 204 and common source 216 and the data state stored in the data-storage structure in selected memory cell 208 is sensed as the analog TDC node voltage stored at TDC node 705. Bit line clamp transistor 704 is switched off to freeze the TDC node voltage at TDC node 705.

Boost driver 708 via the controller may drive the boost value equal to the program verify voltage (PV) (i.e., no aggression condition A illustrated at 802 in FIG. 8A) to set the TDC node voltage at TDC node 705 and stored across TDC capacitance 706 to the frozen TDC node voltage+PV. ADC 710 may convert the analog TDC node voltage to a SA digital value that is stored in SA latch 712. The EN_MATCH signal might be activated via the controller and corresponding SEL_LP signal controlling LP multiplexer 714 and SEL_UP signal controlling UP multiplexer 716 might be activated via the controller depending on the specific verify data state level to determine via the controller if there is a match between the TDC node voltage and the target data state stored in the respective lower page target latch $306_{LP}$ and upper page target latch $306_{UP}$. The EN_MATCH signal and the outputs of multiplexers 714 and 716 are provided to NAND gate 718 which controls transistor 720. If there is no match (fail condition), transistor 720 is switched on to discharge the voltage on the TDC node. If there is a match (pass condition), transistor 720 is switched off and the TDC node voltage at TDC node 705 is maintained at the frozen TDC node voltage+PV.

The EN_AGGR signal might be activated via the controller to determine via the controller if there is a match between the current aggression amount (in this case no aggression) and the one aggressor bit stored in lower page aggressor latch $908_{LP}$. The EN_AGGR signal and the output of lower page aggressor latch $908_{LP}$ are provided to an AND gate 902 which controls a transistor 904. If there is no match, transistor 904 is switched on to discharge the voltage on the TDC node. If there is a match, transistor 904 is switched off and the TDC node voltage at TDC node 705 is maintained at the frozen TDC node voltage+PV. ADC 710 may convert the analog TDC node voltage representing the analog pass/fail condition to a SA digital pass/fail value that is stored in SA latch 712.

The RST_TARGET signal and the output SA of SA latch 712 are provided to AND gate 730 which controls transistor 732. The RST_TARGET signal is activated via the controller to pass on the inhibit condition represented by SA. If the RST_TARGET signal is activated via the controller and SA is equal to 1, transistor 732 is switched on to discharge lower page target latch $306_{LP}$ and upper page target latch $306_{UP}$ to inhibit further program verifies and further programming of the selected memory cell 208. If the RST_TARGET signal is not activated via the controller or if the RST_TARGET signal is activated via the controller and SA is equal to 0, transistor 732 is switched off to maintain the target data state stored in the respective lower page target latch $306_{LP}$ and upper page target latch $306_{UP}$.

The boost driver 708 via the controller may drive the boost value equal to (PV−1δ) (i.e., aggression condition B illustrated at 804 in FIG. 8B) to set the TDC node voltage at TDC node 705 to the frozen TDC node voltage+(PV−1δ). ADC 710 may convert the analog TDC node voltage to a SA digital value that is stored in SA latch 712. The EN_MATCH signal might be activated via the controller and corresponding SEL_LP signal controlling LP multiplexer 714 and SEL_UP signal controlling UP multiplexer 716 might be activated via the controller depending on the specific verify data state level to determine via the controller if there is a match between the TDC node voltage and the target data state stored in the respective lower page target latch $306_{LP}$ and upper page target latch $306_{UP}$. If there is no match (fail condition), transistor 720 is switched on to discharge the voltage on the TDC node. If there is a match (pass condition), transistor 720 is switched off and the TDC node voltage at TDC node 705 is maintained at the frozen TDC node voltage+(PV−1δ).

The EN_AGGR signal might be activated via the controller to determine via the controller if there is a match between the current aggression amount (in this case aggression) and the one aggressor bit stored in lower page aggressor latch $908_{LP}$. If there is no match, transistor 904 is switched on to discharge the voltage on the TDC node. If there is a match, transistor 904 is switched off and the TDC node voltage at TDC node 705 is maintained at the frozen TDC node voltage+(PV−1δ). ADC 710 may convert the analog TDC node voltage representing the analog pass/fail condition to a SA digital pass/fail value that is stored in SA latch 712.

The RST_TARGET signal is activated via the controller to pass on the inhibit condition represented by SA. If the RST_TARGET signal is activated via the controller and SA is equal to 1, transistor 732 is switched on to discharge lower page target latch $306_{LP}$ and upper page target latch $306_{UP}$ to inhibit further program verifies and further programming of the selected memory cell 208. If the RST_TARGET signal is not activated via the controller or if the RST_TARGET signal is activated via the controller and SA is equal to 0, transistor 732 is switched off to maintain the target data state stored in the respective lower page target latch $306_{LP}$ and upper page target latch $306_{UP}$.

The above described example sequence 950 in the example program verify operation has boost driver 708 drive the boost value equal to (PV−nδ) (where −nδ is a current aggression amount) to set the TDC node voltage at TDC node 705 to the frozen TDC node voltage+(PV−nδ) and verifies if there is a match between the current aggression amount (−nδ) and the one aggressor bit stored in aggressor latch 908 in an order of no aggression, aggression. Other embodiments might have a different order of boosting the TDC node voltage by a current aggression amount and checking the current aggression amount and the one aggressor bit stored in aggressor latch 908 (e.g., an order of aggression, no aggression).

Figure 10:
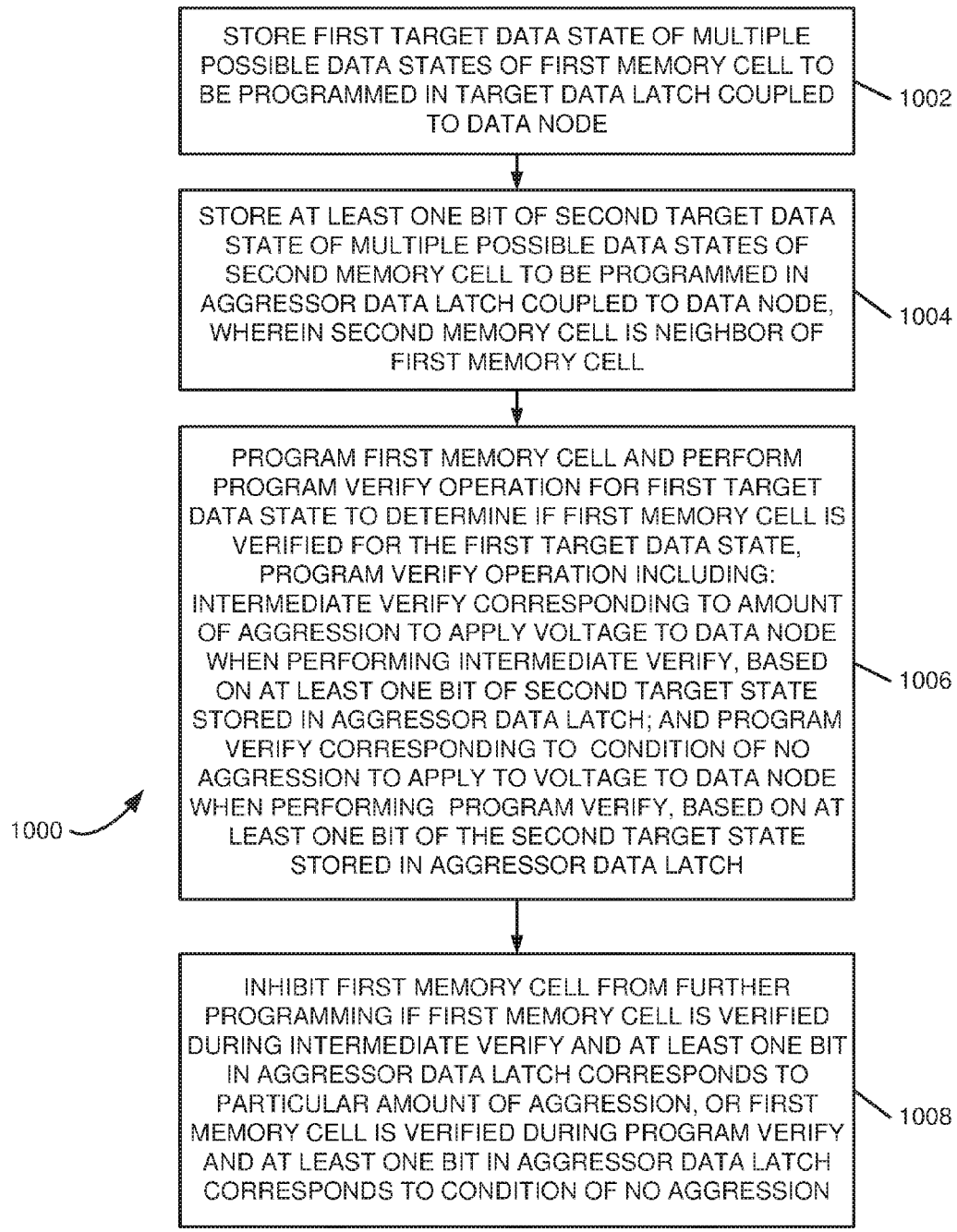
FIG. 10 is a flow diagram illustrating one embodiment of a method of operating a memory.

FIG. 10 is a flow diagram illustrating one embodiment of a method 1000 of operating a memory. At 1002, a first target data state of multiple possible data states of a first memory cell to be programmed is stored in a target data latch coupled to a data node. The first memory cell may be coupled to a first access line (e.g., a word line). At 1004, at least one bit of a second target data state of the multiple possible data states of a second memory cell to be programmed is stored in an aggressor data latch coupled to the data node. The second memory cell may be coupled to a second access line (e.g., a word line). The second memory cell is a neighbor of and may be a potential aggressor to the first memory cell. The target data latch and the aggressor data latch may be in a data buffer.

At 1006, the first memory cell is programmed and a program verify operation is performed for the first target data state to determine via the controller if the first memory cell is verified for the first target data state. The program verify operation comprises: an intermediate verify corresponding to an amount of aggression to apply a voltage to the data node when performing the intermediate verify, based on the at least one bit of the second target state stored in the aggressor data latch; and a program verify corresponding to a condition of no aggression to apply to the voltage to the data node when performing the program verify, based on the at least one bit of the second target state stored in the aggressor data latch.

At 1008, the first memory cell is inhibited from further programming if the first memory cell is verified during the intermediate verify and the at least one bit in the aggressor data latch corresponds to the particular amount of aggression, or the first memory cell is verified during the program verify and the at least one bit in the aggressor data latch corresponds to the condition of no aggression.

Figure 11:
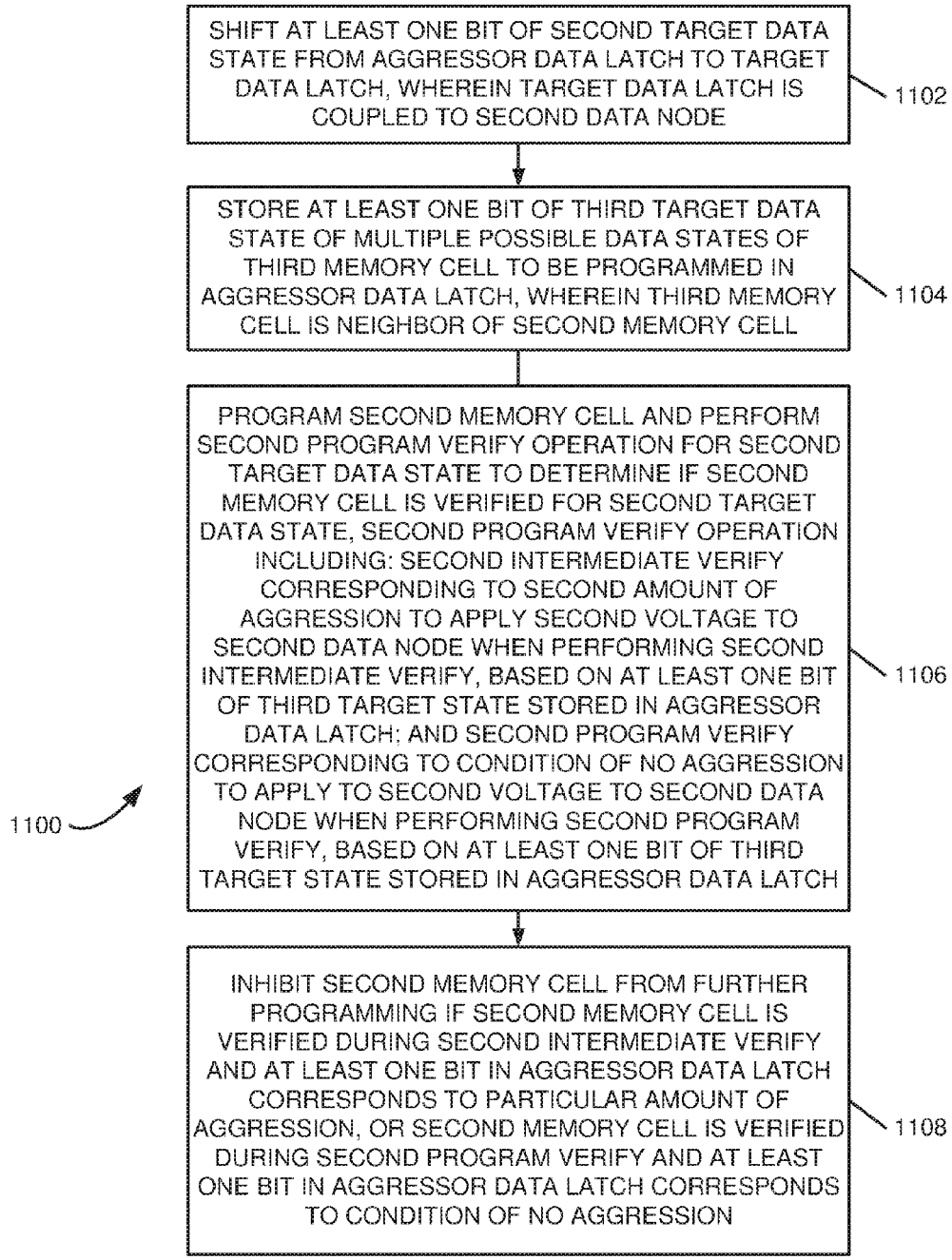
FIG. 11 is a flow diagram illustrating one embodiment of a method of operating a memory.

FIG. 11 is a flow diagram illustrating one embodiment of a method 1100 of operating a memory. At 1102, the at least one bit of the second target data state is shifted from the aggressor data latch to the target data latch. The target data latch may be coupled to a second data node. At 1104, at least one bit of a third target data state of the multiple possible data states of a third memory cell to be programmed is stored in the aggressor data latch. The third memory cell may be coupled to a third access line (e.g., a word line). The third memory cell is a neighbor of and may be a potential aggressor to the second memory cell.

At 1106, the second memory cell is programmed and a second program verify operation is performed for the second target data state to determine via the controller if the second memory cell is verified for the second target data state. The second program verify operation comprises: a second intermediate verify corresponding to a second amount of aggression to apply a second voltage to the second data node when performing the second intermediate verify, based on the at least one bit of the third target state stored in the aggressor data latch; and a second program verify corresponding to a condition of no aggression to apply to the second voltage to the second data node when performing the second program verify, based on the at least one bit of the third target state stored in the aggressor data latch.

At 1108, the second memory cell is inhibited from further programming if the second memory cell is verified during the second intermediate verify and the at least one bit in the aggressor data latch corresponds to the particular amount of aggression, or the second memory cell is verified during the second program verify and the at least one bit in the aggressor data latch corresponds to the condition of no aggression.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
   storing a first target data state of multiple possible data states of a first memory cell to be programmed in a target data latch coupled to a data node;
   storing at least one bit of a second target data state of the multiple possible data states of a second memory cell to be programmed in an aggressor data latch coupled to the data node, wherein the second memory cell is a neighbor of the first memory cell;
   programming the first memory cell and performing a program verify operation for the first target data state to determine if the first memory cell is verified for the first target data state, the program verify operation comprising:
      an intermediate verify corresponding to an amount of aggression to apply a voltage to the data node when performing the intermediate verify, based on the at least one bit of the second target state stored in the aggressor data latch; and
      a program verify corresponding to a condition of no aggression to apply to the voltage to the data node when performing the program verify, based on the at least one bit of the second target state stored in the aggressor data latch; and
   inhibiting the first memory cell from further programming if the first memory cell is verified during the intermediate verify and the at least one bit in the aggressor data latch corresponds to the particular amount of aggression, or the first memory cell is verified during the program verify and the at least one bit in the aggressor data latch corresponds to the condition of no aggression.

2. The method of claim 1, the program verify operation comprising:
   applying a program verify voltage to the data node during the program verify, based on the at least one bit of the second target state stored in the aggressor data latch; and
   applying the program verify voltage minus the amount of aggression to the data node during the intermediate verify, based on the at least one bit of the second target state stored in the aggressor data latch.

3. The method of claim 1, comprising:
   shifting the at least one bit of the second target data state from the aggressor data latch to the target data latch;
   storing at least one bit of a third target data state of the multiple possible data states of a third memory cell to be programmed in the aggressor data latch, wherein the third memory cell is a neighbor of the second memory cell;
   programming the second memory cell and performing a second program verify operation for the second target data state to determine if the second memory cell is verified for the second target data state, the second program verify operation comprising:
      a second intermediate verify corresponding to a second amount of aggression to apply a second voltage to the data node when performing the second intermediate verify, based on the at least one bit of the third target state stored in the aggressor data latch; and
      a second program verify corresponding to a condition of no aggression to apply to the second voltage to the data node when performing the second program verify, based on the at least one bit of the third target state stored in the aggressor data latch; and
   inhibiting the second memory cell from further programming if the second memory cell is verified during the second intermediate verify and the at least one bit in the aggressor data latch corresponds to the particular amount of aggression, or the second memory cell is verified during the second program verify and the at least one bit in the aggressor data latch corresponds to the condition of no aggression.

4. The method of claim 1, wherein the first memory cell and the second memory cell have more than two possible data states.

5. The method of claim 1, wherein performing the program verify operation includes more than one intermediate verify, each intermediate verify corresponding to a respective amount of aggression to apply the voltage to the data node when performing the intermediate verify, based on the at least one bit of the second target state stored in the aggressor data latch.

6. The method of claim 1, wherein:
storing in the aggressor data latch includes storing at least two bits of the second target data state in the aggressor data latch; and
wherein in the program verify operation the at least two bits of the second target data state stored in the aggressor data latch define the amount of aggression.

7. The method of claim 1, wherein performing the program verify operation includes only one intermediate verify.

8. The method of claim 1, wherein:
storing in the aggressor data latch includes storing only one bit of the second target data state in the aggressor data latch; and
wherein in the program verify operation the one bit of the second target data state stored in the aggressor data latch defines the amount of aggression.

9. The method of claim 1, wherein the second memory cell is to be programmed after the first memory cell is programmed.

10. A memory comprising:
a first memory cell to be programmed coupled to a data line;
a second memory cell to be programmed that is a neighbor of the first memory cell;
a data node coupled to the data line;
a target data latch coupled to the data node;
an aggressor data latch coupled to the data node; and
a controller configured to:
store a first target data state of multiple possible data states for the first memory cell in the target data latch;
store at least one bit of a second target data state of the multiple possible data states of the second memory cell in the aggressor data latch; and
perform a programming operation comprising:
programming a first cell data state in the first memory cell;
sensing the first cell data state as a data node voltage on the data node;
boosting the data node voltage by a program verify voltage adjusted by an aggression amount;
determining if there is a target match between the boosted node voltage and the first target data state stored in the target data latch;
determining if there is an aggressor match between the aggression amount and the at least one bit of the second target data state stored in the aggressor data latch; and
inhibiting further programming of the first memory cell if there is a target match and an aggressor match.

11. The memory of claim 10, wherein performing the programming operation comprises:
programming a threshold voltage in the first memory cell corresponding to all bits of the first cell data state.

12. The memory of claim 10, comprising:
an analog-to-digital converter to covert the boosted data node voltage from an analog voltage to a digital value to be used to determine if there is a target match between the boosted data node voltage and the first target data state stored in the target data latch.

13. The memory of claim 10, comprising:
a clamp transistor to freeze the data node voltage before the data node voltage is boosted by the program verify voltage adjusted by the aggression amount.

14. The memory of claim 10, comprising:
a third memory cell to be programmed that is a neighbor of the second memory cell;
wherein the controller is configured to:
shift the at least one bit of the second target data state from the aggressor data latch to the target data latch in the data buffer;
store at least one bit of a third target data state of the multiple possible data states of the third memory cell in the aggressor data latch; and
perform another programming operation comprising:
programming a second cell data state in the second memory cell;
sensing the second cell data state as a second data node voltage on the data node;
boosting the second data node voltage by the program verify voltage adjusted by a second aggression amount;
determining if there is a second target match between the boosted second node voltage and the second target data state stored in the target data latch;
determining if there is a second aggressor match between the second aggression amount and the at least one bit of the third target data state stored in the aggressor data latch; and
inhibiting further programming of the second memory cell if there is a second target match and a second aggressor match.

15. The memory of claim 10, wherein the first memory cell and the second memory cell have more than two possible data states.

16. The memory of claim 10, comprising:
a plurality of access lines including a first access line coupled to a control gate of the first memory cell and a second access line coupled to a control gate of the second memory cell.

17. The memory of claim 16 wherein the second access line is one access line from the first access line.

18. A system comprising:
an array of memory cells comprising:
a first memory cell coupled to a data line and having a control gate, and a second memory cell having a control gate, wherein the second memory cell is a neighbor of the first memory cell;
a plurality of access lines including a first access line coupled to the control gate of the first memory cell and a second access line coupled to the control gate of the second memory cell;
a data buffer comprising:
a data node coupled to the data line;
a target data latch coupled to the data node; and
an aggressor data latch coupled to the data node; and
a controller configured to:
store a first target data state of multiple possible data states for the first memory cell in the target data latch;

store at least one bit of a second target data state of the multiple possible data states of the second memory cell in the aggressor data latch;

program the first memory cell and perform a program verify operation for the first target data state to determine if the first memory cell is verified for the first target data state, the program verify operation comprising:

an intermediate verify corresponding to an amount of aggression to apply a voltage to the data node when performing the intermediate verify, based on the at least one bit of the second target state stored in the aggressor data latch; and a program verify corresponding to a condition of no aggression to apply to the voltage to the data node when performing the program verify, based on the at least one bit of the second target state stored in the aggressor data latch; and inhibit the first memory cell from further programming if the first memory cell is verified during the intermediate verify and the at least one bit in the aggressor data latch corresponds to the particular amount of aggression, or the first memory cell is verified during the program verify and the at least one bit in the aggressor data latch corresponds to the condition of no aggression.

19. The system of claim 18, wherein the controller is configured to:

perform the program verify operation comprising:

apply a program verify voltage to the data node during the program verify, based on the at least one bit of the second target state stored in the aggressor data latch; and apply the program verify voltage minus the amount of aggression to the data node during the intermediate verify, based on the at least one bit of the second target state stored in the aggressor data latch.

20. The system of claim 18, comprising:

wherein the array of memory cells comprises a third memory cell to be programmed having a control gate, wherein the third memory cell is a neighbor of the second memory cell;

wherein the plurality of access lines includes a third access line coupled to the control gate of the third memory cell; and wherein the controller is configured to:

shift the at least one bit of the second target data state from the aggressor data latch to the target data latch in the data buffer;

store at least one bit of a third target data state of the multiple possible data states of the third memory cell in the aggressor data latch;

program the second memory cell and perform a second program verify operation for the second target data state to determine if the second memory cell is verified for the second target data state, the second program verify operation comprising:

a second intermediate verify corresponding to a second amount of aggression to apply a second voltage to the data node when performing the second intermediate verify, based on the at least one bit of the third target state stored in the aggressor data latch; and a second program verify corresponding to a condition of no aggression to apply to the second voltage to the data node when performing the second program verify, based on the at least one bit of the third target state stored in the aggressor data latch; and inhibit the second memory cell from further programming if the second memory cell is verified during the second intermediate verify and the at least one bit in the aggressor data latch corresponds to the particular amount of aggression, or the second memory cell is verified during the second program verify and the at least one bit in the aggressor data latch corresponds to the condition of no aggression.

* * * * *